(12) United States Patent
Funk et al.

(10) Patent No.: US 7,212,878 B2
(45) Date of Patent: *May 1, 2007

(54) WAFER-TO-WAFER CONTROL USING VIRTUAL MODULES

(75) Inventors: Merritt Funk, Austin, TX (US); Wesley Natzle, New Paltz, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/927,500

(22) Filed: Aug. 27, 2004

(65) Prior Publication Data

US 2006/0047356 A1 Mar. 2, 2006

(51) Int. Cl.
*G06F 19/00* (2006.01)

(52) U.S. Cl. ..................................... 700/121; 438/711

(58) Field of Classification Search ............. 700/121; 438/711
See application file for complete search history.

(56) References Cited

U.S. PATENT DOCUMENTS

| | | | |
|---|---|---|---|
| 5,980,591 A | | 11/1999 | Akimoto et al. |
| 6,447,370 B1 | * | 9/2002 | Weldon ........................ 451/6 |
| 6,708,129 B1 | * | 3/2004 | Pasadyn et al. ............... 702/81 |
| 6,747,734 B1 | | 6/2004 | Ritzdorf et al. |
| 6,842,220 B1 | * | 1/2005 | Dishon et al. ................ 355/27 |
| 2003/0014145 A1 | * | 1/2003 | Reiss et al. .................. 700/121 |
| 2003/0229410 A1 | * | 12/2003 | Smith et al. ................ 700/109 |
| 2004/0200574 A1 | | 10/2004 | Davis et al. |
| 2005/0090927 A1 | * | 4/2005 | Tanaka et al. .............. 700/121 |

FOREIGN PATENT DOCUMENTS

WO  WO 2004/019147 A2  3/2004

* cited by examiner

*Primary Examiner*—Leo Picard
*Assistant Examiner*—Sheela S. Rao
(74) *Attorney, Agent, or Firm*—Pillsbury Winthrop Shaw Pittman LLP

(57) ABSTRACT

The invention relates to controlling a semiconductor processing system. Among other things, the invention relates to a run-to-run controller to create virtual modules to control a multi-pass process performed by a multi-chamber tool during the processing of a semiconductor wafer.

34 Claims, 13 Drawing Sheets

FIG. 1                100

WAFER-TO-WAFER CONTROL USING VIRTUAL MODULES

CROSS-REFERENCE TO RELATED APPLICATIONS

This application is related to U.S. Non-Provisional Patent Application Ser. No. 10/927,514, filed Aug. 27, 2004, entitled "Process Control Using Physical Modules and Virtual Modules," the contents of which are incorporated herein by reference in its entirety.

FIELD OF THE INVENTION

The invention relates to developing process models for semiconductor wafer processing. More particularly, the invention relates to a run-to-run controller to create virtual modules to control a multi-pass process performed by a multi-chamber tool during the processing of a semiconductor wafer.

BACKGROUND OF THE INVENTION

Processing tools used in the semiconductor industry have developed into complex processing systems having a number of associated process modules. Due at least in part to this development trend, the dividing line between the tool control systems and the factory control systems are becoming increasingly blurred. The factory system can allow the tool control system to control certain segments of the process sequence. This can create new opportunities for tailored control and optimization of segments of the process sequence on a lot-to-lot basis or even on a wafer-to-wafer basis, but new challenges can also be created. If the factory control system cedes control over the wafers to the tool platform, then it also must cede direct knowledge of what actually happens to the wafers to the same platform. As a result, a new architecture should be created for the integration of the tool platform with the factory control system. The new architecture would require the tool platform to report what happened to the wafers including recipes, measured data, events, exceptions, etc. The new architecture must require the factory system to set up a framework to be followed by the tool platform, including process limits, allowable conditions, and required response to exceptions.

In addition, multi-module tools need to interface with factory systems that adhere to Semiconductor Equipment and Materials International (SEMI) standards.

Data from multiple events performed in a particular module, which need to be reported to the factory system, can be written by the controller of the tool platform or by the factory system controllers upon a subsequent visit of the wafer to the same module. One limitation of this arrangement is that recipes cannot be associated with the physical module, because the physical module is used more than once. Moreover, the physical module may perform different operations.

One way to resolve this problem is to find a way for the factory and tool information systems to deal with multiple passes to the same module in a multi-chamber process tool. In addition, for a multi-chamber system having the problem of establishing routing that may be different for each wafer (wafer sampling) and/or establishing a dynamic routing which is determined by the tool (again including wafer sampling), a secondary solution is required. In particular, demand has developed for an information systems architecture that is able to function when each module samples the wafers differently, when the wafers can make more that one pass through a physical module, and when the tool can change the sequence or sampling.

For semiconductor processing, it is well-established that feedforward controllers may be used in the fabrication of semiconductor integrated circuits by semiconductor manufacturing facilities (fabs). Until recently, wafers were treated as a batch or a lot and the same processing was performed on each of the wafers in the lot. The size of the lot varies depending on the manufacturing practices of the fab but is typically limited to a maximum of 25 wafers. Measurements were routinely made on a few wafers in the lot and adjustments were made to the processing based on these sample measurements. This method of control which is based on sample measurements on the current lot and process recipe adjustments for ensuing lots is called lot-to-lot control (L2L). The process models and information necessary to modify the process recipes for L2L control were stored and the computations were performed at the fab level. Recently, manufacturers of semiconductor processing equipment (SPE) have included the ability to measure each wafer immediately before and after processing is performed. The capability to measure each wafer on the processing tool is called integrated metrology (IM). IM, in turn, enabled the ability to measure and adjust the process recipe at the wafer-to-wafer (W2W) level. Because of the high volume of data collected and the short period of time between the measurements and subsequent processing of the wafer, it may be necessary to provide the ability to perform wafer-to-wafer (W2W) control at the tool rather than at the fab level.

SUMMARY OF THE INVENTION

One embodiment of the invention provides a method of operating a processing system controller in a semiconductor processing system including a host system and a processing system. The method includes receiving a static virtual module plan (SVMP), where the SVMP includes a desired process result for at least one wafer, a process sequence for at least one wafer, the process sequence comprising (N) virtual module (VM) objects. A first number ($N_{act}$) of the VM objects are visited virtual module (VVM) objects, and a second number ($N_{non}$) of the VM objects are non-visited virtual module (NVVM) objects. A VVM object can be associated with a visit by a wafer to a physical module, and a NVVM object can be associated with a non-visit by a wafer to a physical module. The method can also include executing the process sequence, collecting visited virtual module (VVM) data when a VVM object in the process sequence is executed, and collecting non-visited virtual module (NVVM) data when a NVVM object in the process sequence is executed.

Another embodiment provides a method of operating a host controller in a semiconductor processing system that includes a host system and a processing system. The method includes creating a static virtual module plan (SVMP), where the SVMP comprises a desired process result for at least one wafer and a process sequence for the at least one wafer. The process sequence includes (N) virtual module (VM) objects. A first number ($N_{act}$) of the VM objects are visited virtual module (VVM) objects, and a second number ($N_{non}$) of the VM objects are non-visited virtual module (NVVM) objects. A VVM object can be associated with a visit by a wafer to a physical module, and a NVVM object can be associated with a non-visit by a wafer to a physical module. The method can also include sending the SVMP to the processing system.

Another embodiment provides another method of operating a processing system controller in a semiconductor processing system including a host system and a processing system. The method includes receiving a desired process result for at least one wafer from the host system and creating a dynamic virtual module plan (DVMP). The DVMP has a process sequence for the at least one wafer. The process sequence is created to achieve the desired process result for the at least one wafer. The process sequence can include (N) virtual module (VM) objects. A first number ($N_{act}$) of the VM objects are visited virtual module (VVM) objects, and a second number ($N_{non}$) of the VM objects are non-visited virtual module (NVVM) objects. A VVM object can be associated with a visit by a wafer to a physical module, and a NVVM object can be associated with a non-visit by a wafer to a physical module. The method also includes sending the DVMP to the host system.

Another embodiment provides another method of operating a host controller in a semiconductor processing system that includes a host system and a processing system. The method includes receiving, by a host system, a dynamic virtual module plan (DVMP) from the processing system. The DVMP can include a process sequence for at least one wafer. The process sequence can be created to achieve the desired process result for the at least one wafer. The process sequence can comprise (N) virtual module (VM) objects, where ($N_{act}$) VM objects are visited virtual module (VVM) objects and ($N_{non}$) VM objects are non-visited virtual module (NVVM) objects. A VVM object can be associated with a visit by the at least one wafer to a physical module, and a NVVM object can be associated with a non-visit by the at least one wafer to a physical module. The method can also include executing the DVMP.

Other aspects of the present invention will become apparent from the description that follows and from the drawings appended hereto. The scope of the invention is not limited solely to the aspects described or the embodiments discussed, but extends to any and all equivalents thereof.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF THE EMBODIMENTS

Figure 1:
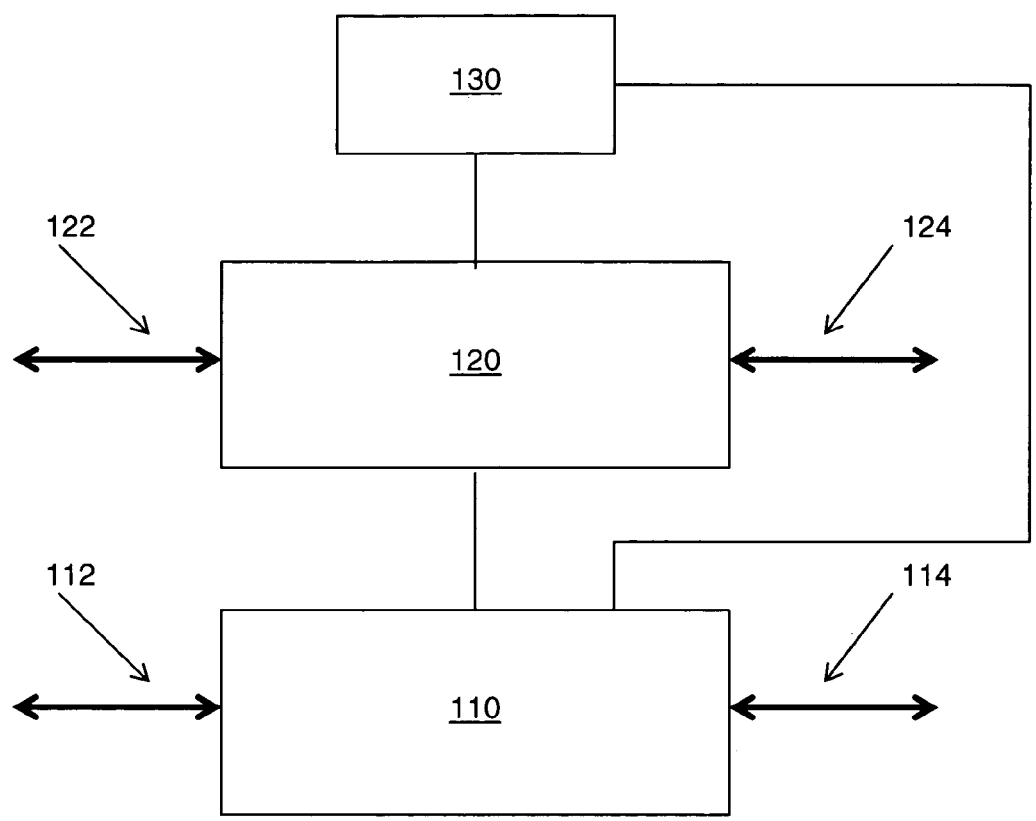
FIG. 1 shows an exemplary block diagram of a processing system in accordance with an embodiment of the present invention.

FIG. 1 shows an exemplary block diagram of a processing system in accordance with an embodiment of the present invention. In the illustrated embodiment, a processing system 100 comprises a processing tool 110, a controller 120 coupled to the processing tool 110, and a manufacturing equipment system (MES) 130 that is coupled to the controller 120 and to the processing tool 110. In addition, at least one of the processing tool 110, the controller 120, and the MES 130 can comprise a Graphical User Interface (GUI) component and/or a database component (not shown). In alternate embodiments, the GUI component and/or the database component are not required.

Some setup and/or configuration information can be obtained by the processing tool 110 and/or the controller 120 from the factory system 130. Factory level business rules can be used to establish a control hierarchy. For example, the processing tool 110 and/or the controller 120 can operate independently, or can be controlled to some degree by the factory system 130. In addition, factory level business rules can be used to determine when a process is paused and/or stopped, and what is done in response to determining that a process has been paused and/or stopped. In addition, factory level business rules can be used to determine when, as well as how, to change the process.

Business rules can also be used to specify the action taken for normal processing and the actions taken on exceptional conditions. The actions can include: (a) initial model loading; (b) pre-etch metrology data filtering; (c) controller recipe selection;(d) post-etch metrology data filtering; (e) feedback calculation; and (f) a model update.

Business rules can be defined at a control strategy level, a control plan level, or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 130 can monitor some system processes using data reported from the databases associated with the processing tool 110 and/or the controller 120. Factory level business rules can be used to determine which processes are monitored and which data is used. For example, the processing tool 110 and/or the controller 120 can independently collect data or the data collection process can be controlled to some degree by the factory system 130. In addition, factory level business rules can be used to determine how to manage the data when a process is changed, paused, and/or stopped.

In addition, the MES 130 can provide run-time configuration information to the processing tool 110 and/or the controller 120. For example, automated process control (APC) settings, targets, limits, rules, and algorithms can be downloaded from the factory to the processing tool 110 and/or the controller 120 as an "APC recipe", an "APC system rule", and "APC recipe parameters" at run-time.

Some setup and/or configuration information can be determined by the processing tool 110 and/or the controller 120 when they are initially configured by the system 100. System-level business rules (system rules) can be used to establish a control hierarchy. For example, the processing tool 110 and/or the controller 120 can operate independently or the processing tool 110 can be controlled to some degree by the controller 120. In addition, system rules can be used to determine when a process is paused and/or stopped, and what is done when a process is paused and/or stopped. In addition, system rules can be used to determine when to change a process and how to change the process. Furthermore, the controller 120 can use tool level rules to control some tool level operations.

In general, rules allow system and/or tool operation to change based on the dynamic state of the system.

Although FIG. 1 depicts one processing tool 110 and one controller 120, it will be appreciated that this is not required for the invention. The semiconductor processing system 100 can comprise any number of processing tools 110 having any number of controllers 120 associated with them in addition to the independent process tools 110 and modules.

The processing tool 110 and/or the controller 120 can be used to configure any number of processing tools 110 having any number of processing tools 110 associated with them in addition to any number of independent process tools 110 and modules. The processing tool 110 and/or the controller 120 can collect, provide, process, store, and display data from processes involving processing tools, processing subsystems, process modules, and sensors.

The processing tool 110 and/or the controller 120 can comprise a number of applications, including: (a) at least one tool-related application; (b) at least one module-related application; (c) at least one sensor-related application; (d) at least one interface-related application; (e) at least one database-related application; (f) at least one GUI-related application; and (g) at least one configuration application.

For example, the system 100 can comprise an Automatic Process Control (APC) system from Tokyo Electron Limited that can include a Unity Tool, a Telius Tool, and/or a Trias Tool and their associated processing subsystems and process modules. In addition, the system can comprise a run-to-run (R2R) controller, such as the Ingenio TL ES server from Tokyo Electron Limited, and an integrated metrology module (IMM) from Tokyo Electron Limited. Alternately, the controller 120 can support other process tools and other process modules.

A GUI component (not shown) can provide easy to use interfaces that enable users to: (a) view tool status and process module status; (b) create and edit x-y charts of summary and raw (trace) parametric data for selected wafers; (c) view tool alarm logs; (d) configure data collection plans that specify conditions for writing data to the database or to output files; (e) input files to statistical process control (SPC) charting, modeling and spreadsheet programs; (f) examine wafer processing information for specific wafers, and review data that is currently being saved to the database; (g) create and edit SPC charts of process parameters, and set SPC alarms which generate e-mail warnings; (h) run multivariate PCA and/or PLS models; and (i) view diagnostics screens in order to troubleshoot and report problems with the controller 120.

Raw data and trace data from the tool can be stored as files in a database. In addition, IM data and host metrology data can be stored in the database. The amount of data depends on the data collection plans that are configured, as well as the frequency with which processes are performed and processing tools are run. The data obtained from the processing tools, the processing chambers, the sensors, and the operating system can be stored in the database.

In an alternate embodiment, the system 100 can comprise a client workstation (not shown). The system 100 can support a plurality of client workstations. A client workstation can allow a user to perform configuration procedures: (a) to view status including tool, controller, process, and factory status; (b) to view current and historical data; (c) to perform modeling and charting functions; and (d) to input data to the controller. For example, a user may be provided with administrative rights that allow the user to control one or more processes performed by a controller.

The processing tool 110 and the controller 120 can be coupled to the MES 130 and can be part of an E-Diagnostic System. The processing tool 110 and/or the controller 120 can exchange information with a factory system. In addition, the MES 130 can send command and/or override information to the processing tool 110 and/or the controller 120. For example, the MES 130 can feed-forward to the processing tool 110 and/or the controller 120 downloadable recipes for any number of process modules, tools, and measuring devices, with variable parameters for each recipe. Variable parameters can include final critical dimension (CD) targets, limits, offsets, and variables in the tool level system that needs to be adjustable by lot. In addition, factory litho CD metrology data can be feed-forwarded to the controller 120.

Furthermore, the MES 130 can be used to provide measurement data, such as critical dimension scanning electron microscope (CD SEM) information, to the controller 120. Alternately, the CD SEM information can be provided manually. Adjustment factors are used to adjust for any offset between the IM and CD SEM measurements. Manual and automated input of CD SEM data includes a timestamp, such as a date, for proper insertion in to the history of the feedback (FB) control loop in the R2R controller.

Configurable items can be configured as a set of variable parameters sent from the factory system using Generic Model SEMI Equipment Communications Standard (GEM SECS) communications protocol. For example, variable parameters can be passed as part of an "APC Recipe". An APC recipe may contain more than one sub recipes and each sub recipe can contain variable parameters.

As noted above, a single processing tool 110 is also shown in FIG. 1, but this is not required for the invention, as additional processing tools can be used. In one embodiment, the processing tool 110 can comprise one or more processing modules. The processing tool 110 can comprise, for example, at least one of an etch module, a deposition module, a polishing module, a coating module, a developing module, and a thermal treatment module.

The processing tool 110 can comprise the links 112, 114 for coupling to at least one other processing tool and/or controller. For example, other processing tools and/or controllers can be associated with a process that has been performed previously and/or other controllers can be associated with a process that is performed subsequently. The links 112, 114 can be used to feed forward and/or feed back information. For example, feed forward information can comprise data associated with an in-coming wafer. This data can include lot data, batch data, run data, composition data, and wafer history data. The data can comprise pre-process data that can be used to establish an input state for a wafer. A first part of the pre-process data can be provided to the controller 120, and a second part of the pre-process data can be provided to the processing tool 110. Alternately, the two parts can comprise the same data.

The processing tool 110 can comprise a single integrated metrology module (IMM) device (not shown) or multiple measurement devices. The system 100 can include module related measurement devices, tool-related measurement devices, and external measurement devices. For example, data can be obtained from sensors coupled to one or more process modules and sensors coupled to the processing tool. In addition, data can be obtained from an external device such as a SEM tool and an Optical Digital Profiling (ODP) tool. An ODP tool is available from Timbre Technologies Inc. (a TEL company) that provides a patented technique for measuring the profile of a feature in a semiconductor device. For example, ODP techniques can be used to obtain critical dimension (CD) information, feature profile information, or via profile information.

The controller 120 is coupled to the processing tool 110 and the MES 130, and information, such as pre-processing data and post-processing data, can be exchanged between them. For example, when an internal reset event is being generated from the tool 110, the controller 120 can send a message, such as an alarm, to the MES 130. This can allow the factory system and/or factory personnel to make the necessary changes to minimize the number of wafers at risk after a major change occurs, such as those that occur during corrective or preventative maintenance.

A single controller 120 is also shown in FIG. 1, but this is not required for the invention, as additional controllers can be used. For example, one controller 120 can comprise a run-to-run (R2R) controller, a feed-forward (FF) controller, a process model controller, a feedback (FB) controller, or a process controller, or a combination of two or more thereof (all not shown in FIG. 1).

The controller 120 can comprise the links 122, 124 for coupling to at least one other controller 120. For example, other controllers 120 can be associated with a process that has been performed previously, and/or other controllers 120 can be associated with a process that is performed subsequently. The links 122, 124 can be used to feed forward and/or feed back information.

The controller 120 can use the difference between a measured critical dimension of the incoming material (input state) and a target critical dimension (desired state) to predict, select, or calculate a set of process parameters to achieve a desired process result that is changing the state of the wafer from the input state to the desired state. For example, this predicted set of process parameters can be a first estimate of a recipe to use based on an input state and a desired state. In one embodiment, data, such as the input state and/or the desired state data, can be obtained from a host.

In one case, the controller 120 knows the input state and a model equation for the desired state for the wafer, and the controller 120 determines a set of recipes that can be performed on the wafer to change the wafer from the input state to a processed state. For example, the set of recipes can describe a multi-step process involving a set of process modules.

The time constant for the controller 120 can be based on the time between measurements. When measured data is available after a lot is completed, the controller's time constant can be based on the time between lots. When measured data is available after a wafer is completed, the controller's time constant can be based on the time between wafers. When measurement data is provided real-time during processing, the controller's time constant can be based on processing steps, within a wafer. When measured data is available while a wafer is being processed or after a wafer is completed or after the lot is completed, the controller 120 can have multiple time constants that can be based on the time between process steps, between wafers, and/or between lots.

One or more controllers can be operating at any point in time. For example, one controller can be in an operating mode while a second controller can be in a monitoring mode. In addition, another controller can be operating in a simulation mode. A controller can comprise a single loop or multiple loops, and the loops can have different time constants. For example, loops can be dependent on wafer timing, lot timing, batch timing, chamber timing, tool timing, and/or factory timing.

The controller 120 can operate as a single input single output (SISO) device, as a single input multiple output (SIMO) device, as a multiple input single output (MISO) device, and as a multiple input multiple output (MIMO) device. In addition, inputs and outputs can be within a controller and/or between one or more controllers. For example, when multiple inputs such as CD and sidewall angle are being used, inputs and outputs can be fed forward and backward between two modules, (i.e., one for CD control and one for sidewall angle control). In addition, a mask open controller can also be used. In a multi-process case including multiple modules, information can be fed-forward or fed-back from one controller to another controller.

The controller 120 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. In addition, models can include SPC charts, PLS models, PCA models, Fitness Distance Correlation (FDC) models, and Multivariate Analysis (MVA) models.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller 120 can receive and execute models (PLS, PCA, etc.) that were created by external applications and sent to the controller 120.

The controller 120 can comprise one or more filters (not shown) to filter the metrology data in order to remove the random noise. An outlier filter can be used to remove outliers that are statically not valid and should not be considered in the calculation of the mean of a wafer measurement. A noise filter can be used to remove random noise and stabilize the control loop, an Exponentially Weighted Moving Average (EWMA) or Kalman filter can be applied.

The controller 120 can send and receive notification of an exception condition. For example, the controller 120 can send and receive notifications to and from a factory level controller or a tool level controller. In addition, a notification can be sent via the e-Diagnostics network, e-mail, or pager after the identification of an exception condition.

The controller 120 can comprise a database component for archiving input and output data. For example, the controller 120 can archive received inputs, sent outputs, and actions taken by the controller 120 in a searchable database. In addition, the controller 120 can comprise means for data backup and restoration. In addition, the searchable database can include model information, configuration information, and historical information and the controller 120 can use the database component to backup and restore model information and model configuration information both historical and current.

The controller 120 can comprise a web based user interface. For example, the controller 120 can comprise a web enabled GUI component for viewing the data in the database. The controller 120 can comprise a security component that can provide for multiple levels of access depending on the permissions granted by a security administrator. The controller 120 can comprise a set of default models that are provided at installation time, so that the controller can reset to default conditions.

The controller 120 can take various actions in response to an exception, depending on the nature of the exception. The actions taken on exception can be based on the business rules established for the context specified by the system recipe, process recipe, module type, module identification number, load port number, cassette number, lot number, control job ID, process job ID and/or slot number.

The controller 120 has the capability of managing multiple process models that are executed at the same time and are subject to different sets of process recipe constraints. The controller 120 can run in three different modes: simulation mode, test mode, and standard mode. The controller 120 can operate in simulation mode in parallel with the actual process mode.

When two different recipes may be performed by the same physical module (PM), and if virtual modules are not used, the data associated with the first pass through the physical module can become confused with the data associated with the second pass through the physical module. If virtual modules are not used, the controller 120 and/or a host controller may over-write the data from the first pass through a module with the data from the second pass through the module.

In one embodiment, a naming convention such as ($VM_x$) can be used. For example, the first virtual module can be identified as $VM_1$, and the n(th) virtual module can be identified as $VM_n$. Alternately, other naming conventions can be used, such as module(xx) or (MODxx). For example, virtual module data can be stored in a database using the virtual module name as an index item.

In another embodiment, the host system can comprise one or more external measurement modules, such as a CD SEM module or transmission electron microscopy (TEM) module, and virtual modules can be used to establish process sequences that include visits to external measurement modules and to establish a naming convention for data files associated with external measurement modules. The host level controller and/or the R2R controller can use the data files associated with the external measurement module. In addition, different external measurement modules can be used to perform different recipes. Virtual modules can be used to allow tool level and/or system level controllers to schedule external measurement module usage to maximize external measurement module utilization and minimize the throughput time.

In addition, virtual modules can be used when processing system controllers execute simulation models. The results from simulation model executions can be stored and tracked using virtual modules.

In one case, the host can provide a routing sequence that instructs the controller 120 to use one or more virtual modules. The host can provide the naming convention to use when data is stored and/or passed between the controller and the host. The host can assign virtual module names to one or more of the process steps in the process sequence. The controller 120 can create a process job for each virtual module and associate a physical module (PM) with each virtual module (VM). In another case, the host can allow a lower level controller to create virtual modules. As processing tools become more complex tool level and/or system level controllers may be used to determine which processing and/or measurement modules to use based on maximizing resource utilization and minimizing throughput time. Virtual modules can be used to allow tool level and/or system level controllers to schedule physical module usage to maximize process module utilization and minimize the throughput time.

The controller 120 can create a process job for each virtual module and associate a physical with each virtual module (VM).

When the semiconductor processing system 100 includes a host system and one or more processing systems, the host system can operate as the master system and can control and/or monitor a major portion of the processing operations. The host system can create a static virtual module plan (SVMP) that includes a process sequence, and can send the SVMP to the processing system. In one embodiment, the process sequence can comprise a sequence of virtual module (VM) objects.

Figure 2:
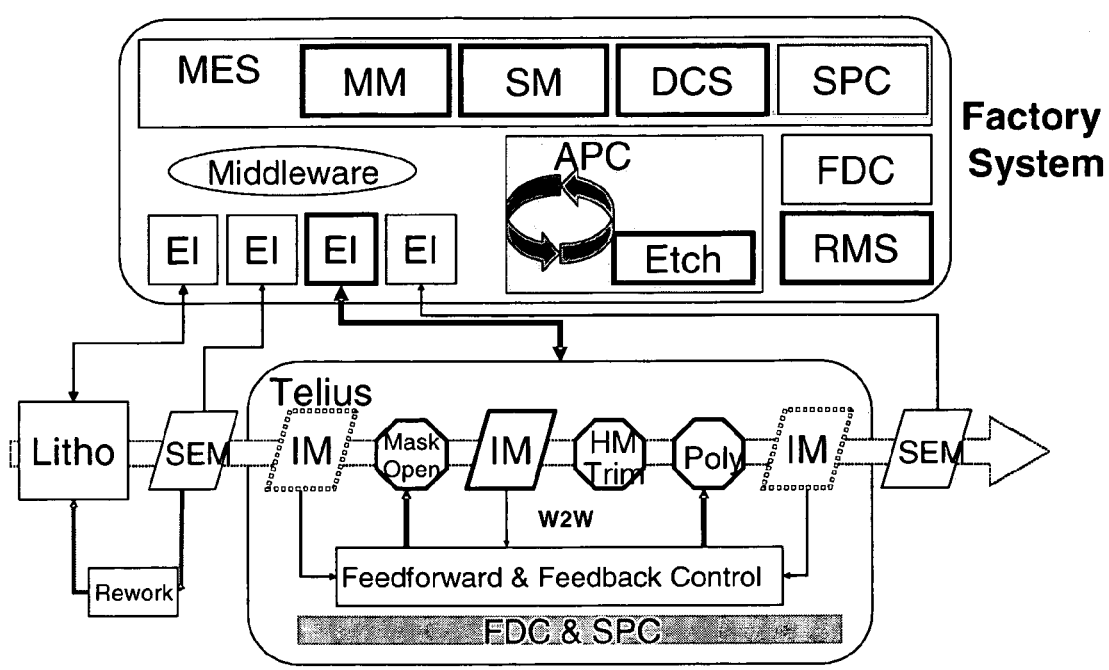
FIG. 2 shows a simplified block diagram of a factory integration configuration in accordance with an embodiment of the invention.

FIG. 2 shows a simplified block diagram of a factory integration configuration, in accordance with an embodiment of the invention. In the illustrated embodiment, a factory system is shown coupled to a processing system. One processing system contemplated for use with the invention is the TELIUS™ processing system offerd by Tokyo Electron Limited. As would be appreciated by those skilled in the art, however, other processing systems may be employed without departing from the scope of the invention.

As illustrated, the factory system is the MES 130, which includes, inter alia, advanced process control (APC) capabilities, data collection strategies (DCS), fitness distance correlation modules (FDC), and diagnostic systems E1. In the example shown, the MES 130 factory system communicates and exchanges information with the TELIUS™ processing system via E diagnostic links.

Figure 3:
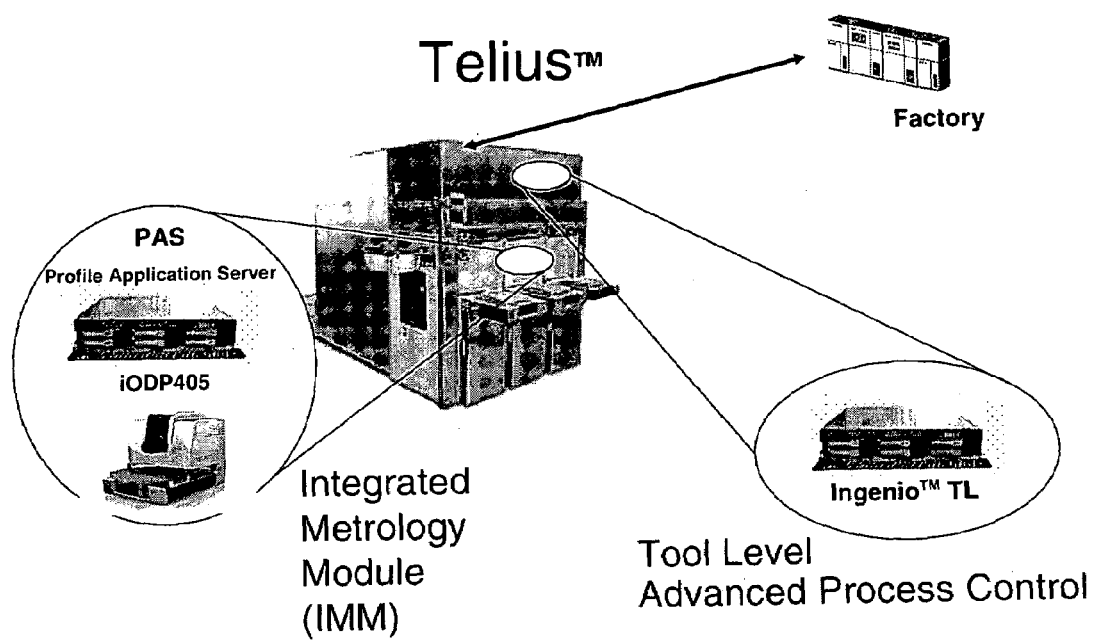
FIG. 3 shows a simplified block diagram of an integrated processing system in accordance with an embodiment of the invention.

FIG. 3 shows a simplified block diagram of an integrated processing system, in accordance with an embodiment of the invention. In the illustrated embodiment, a processing system, such as the TELIUS™ processing system, is shown which comprises a processing tool, an integrated metrology module (IMM), and a tool level Advanced Process Control (APC) controller.

Figure 4:
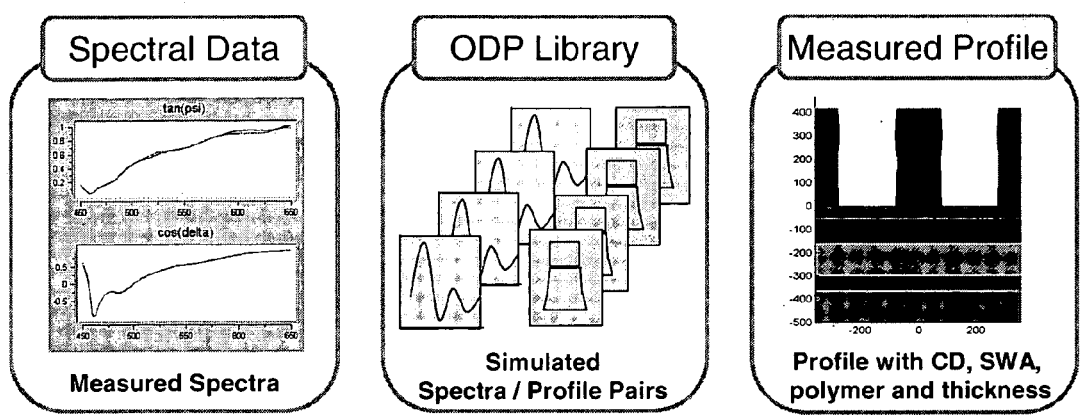
FIG. 4 shows a simplified flow diagram for an integrated measurement process in accordance with an embodiment of the invention.

FIG. 4 shows a simplified diagram for an integrated measurement process, in accordance with an embodiment of the invention. In the illustrated embodiment, the Integrated Metrology (IM) process is based on Optical Digital Profilometry (ODP) techniques. For example, spectra data are collected on a processed (e.g., etched and/or trimmed) wafer and matched to simulated spectra in ODP Library. The matched spectra correspond to a profile with CD, film thickness and sidewall polymer information. The metrology data can be reported to processing system and/or the host system.

Figure 5:
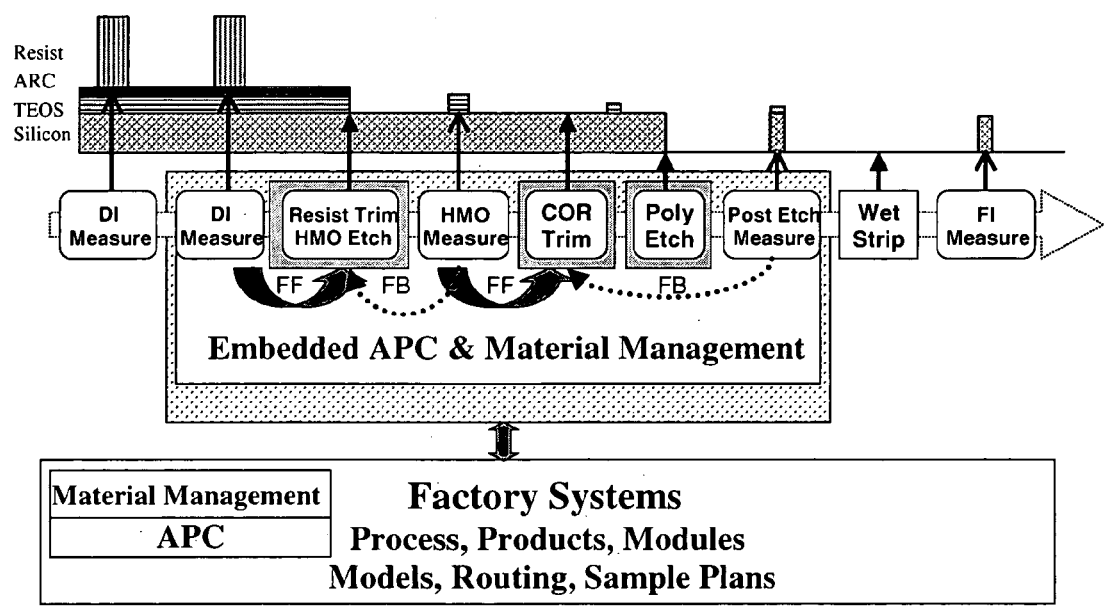
FIG. 5 shows a simplified flow diagram of a multi-step process sequence in accordance with an embodiment of the invention.

FIG. 5 shows a simplified flow diagram of a multi-step process sequence, in accordance with an embodiment of the invention. In the illustrated embodiment, a number of measurement steps are shown and a number of processing steps (e.g., resist trim, etch, cor trim, etc.), as well as feedback and feedforward control capabilities are shown. One or more virtual module objects can be created for each measurement step and each processing step shown. This is not required for the invention. Alternate process sequences can be used, and a different number of virtual module objects can be used.

Figure 6:
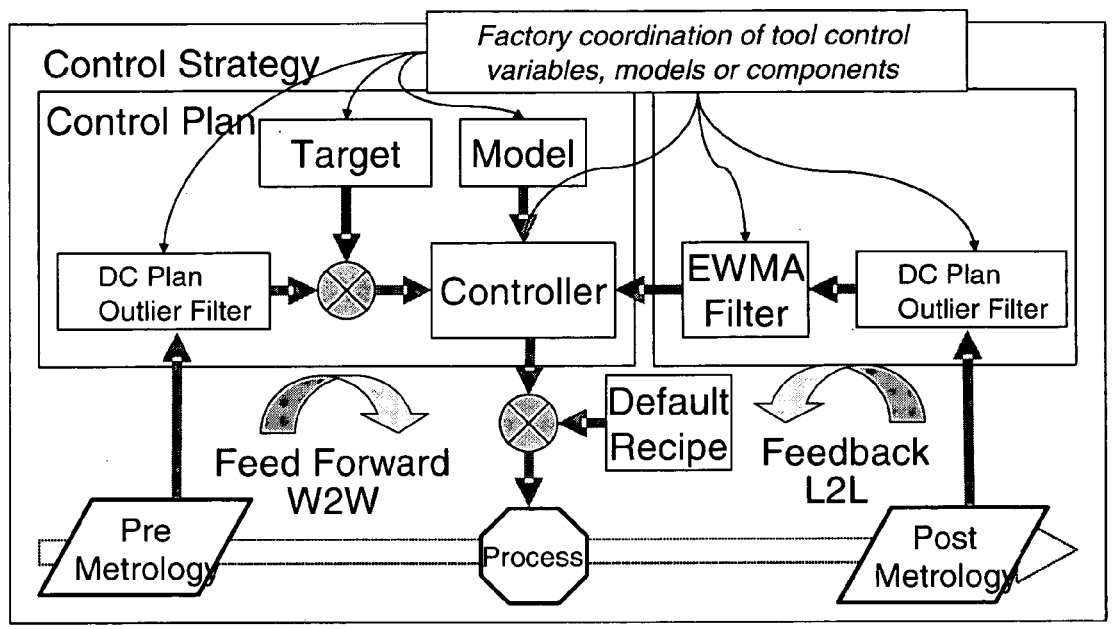
FIG. 6 shows a simplified block diagram of a control process in accordance with an embodiment of the invention.

FIG. 6 shows a simplified block diagram of a control process, in accordance with an embodiment of the invention. In the illustrated embodiment, a simplified block diagram of a control plan is shown. Virtual module control plans and/or strategies can be created and mapped to physical modules.

Figure 7:
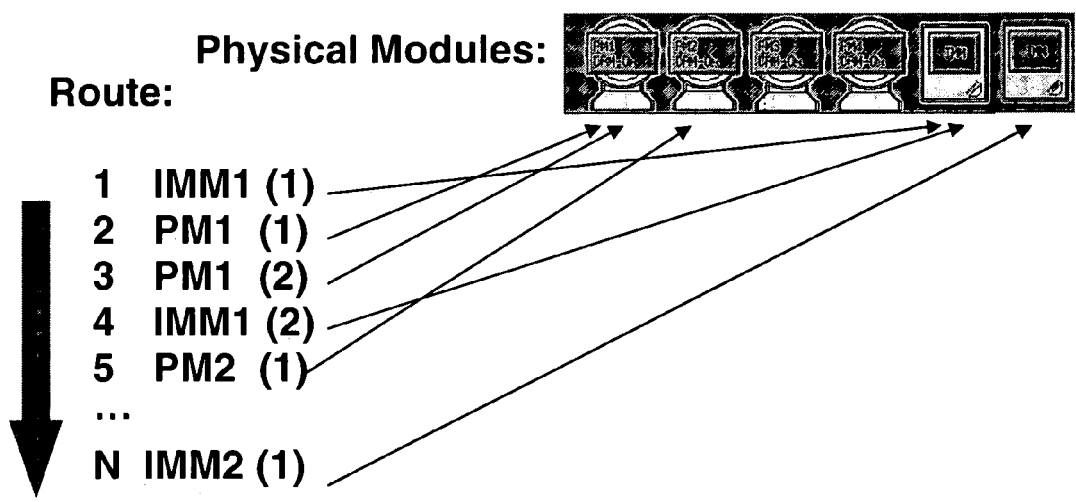
FIG. 7 shows an exemplary relationship diagram for physical modules in accordance with an embodiment of the invention.

FIG. 7 shows an exemplary relationship diagram for physical modules, in accordance with an embodiment of the invention. In the illustrated embodiment, six physical modules are shown and the six physical modules include four processing modules (PM1–PM4) and two measurement modules (IMM1 and IMM2). This is not required for the invention. As in alternate embodiments, the number of physical modules and their arrangement can be different.

An exemplary routing or process sequence is also shown, but this is not required for the invention. In an alternate embodiment, a different sequence can be used. For example, a virtual module can be used for each routing step.

Figure 8:
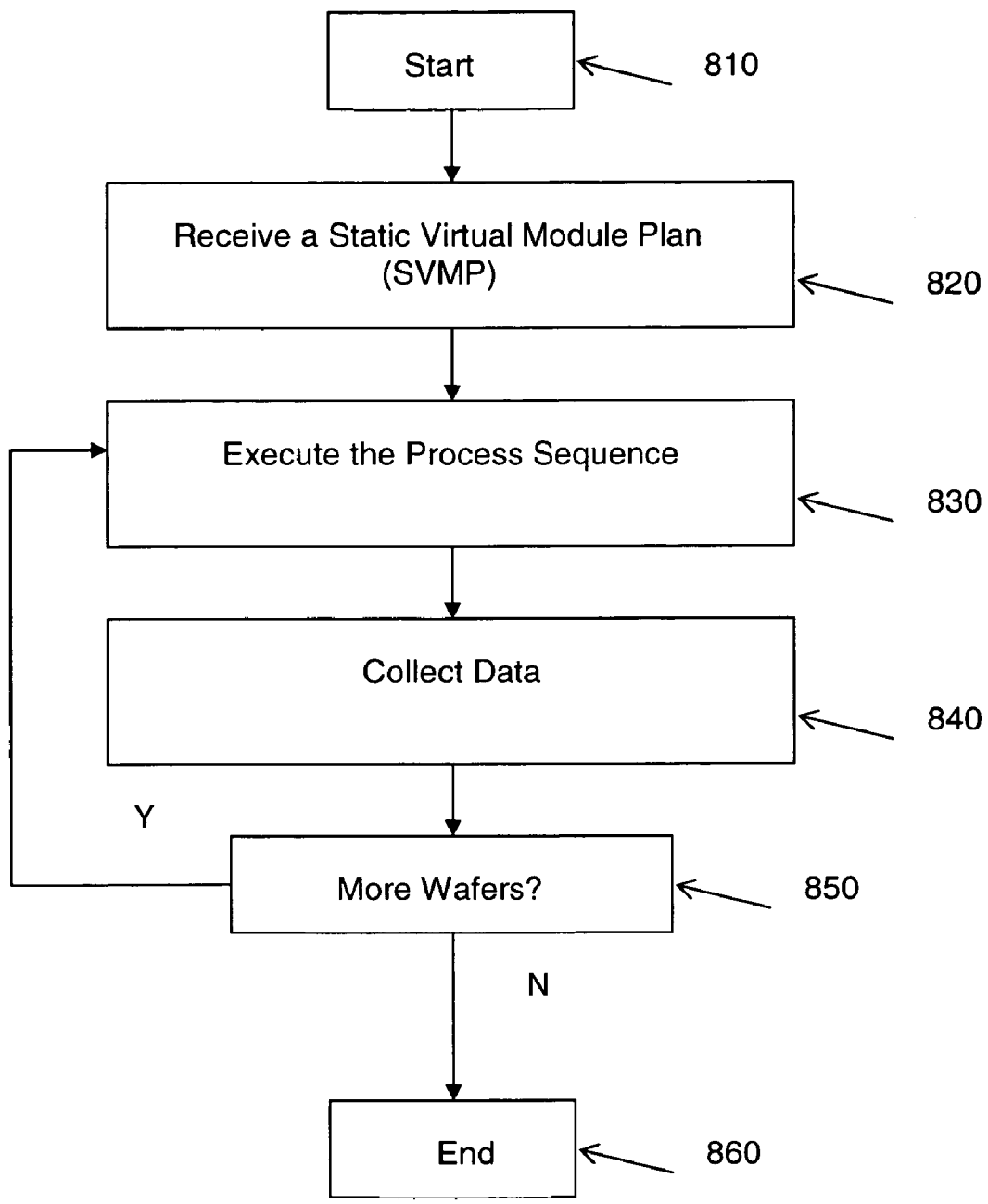
FIG. 8 shows a flow diagram for a method of operating a processing system controller in accordance with an embodiment of the invention.

FIG. 8 provides a flow diagram for a method of operating a processing system controller, in accordance with an embodiment of the invention. In the illustrated embodiment, a wafer-based procedure 800 is shown, but this is not required for the invention. That is, the procedure may be a lot-based or a batch-based procedure. Procedure 800 starts in task 810, and a start event can be, for example, a host event, a wafer-in event, a lot-start event, a batch start event, or an end event from another process.

The processing system can comprise processing modules and measurement modules. The processing module may comprise an etch module, a deposition module, a chemical oxide removal (COR) module, a heating module, a transfer module, a cooling module, a development module, or a combination of two or more processing modules thereof. The measurement modules can include an optical measurement module, an optical digital profile (ODP) module, a SEM module, a TEM module, or combination of two or more measurement modules thereof.

In task 820, the processing system controller receives a static virtual module plan (SVMP) for a wafer from a host system. The SVMP may comprise a set of instructions for the processing system to use in order to process one or more wafers. When a SVMP is used, the host system acts as the master controller.

The SVMP may also comprise a desired process result for the wafer that can be determined by the host system. The desired process result may include a trim amount, an etch amount, a deposition amount, or a combination of two or more thereof.

Moreover, the SVMP can comprise an actual number of passes ($N_{act}$) through a physical module that the wafer can use to achieve the desired process result, a maximum number of passes ($N_{max}$) through a physical module that the wafer can use to achieve the desired process result, and a number of non-visits ($N_{non}$) to a physical module. The SVMP may comprise a process recipe for each physical module.

Furthermore, the SVMP can comprise a multi-visit plan in which the plan can be used when different wafers make a different number of visits to a processing module. The multi-visit plan can be wafer-dependent, that is, some wafers will require multiple visits to a processing module while other wafers may require a single or no visit to a processing module.

In one embodiment, the multi-visit plan can be determined by the host controller and sent to the R2R controller. In an alternate embodiment, another controller, such as a R2R controller, can be used to create and/or modify a multi-visit plan.

Additionally, the SVMP can comprise a sampling plan in which the sampling plan can be used when different wafers make a different number of visits to a measurement module. The sampling plan can also be used to determine when pre-process and post-process measurements are made. Like the multi-visit plan, the sampling plan can be wafer-dependent where some wafers require multiple visits to a measurement module while other wafers may require a single or no visit to a measurement module.

In one embodiment, the sampling plan can be determined by the host controller and sent to the R2R controller. In an alternate embodiment, another controller, such as a R2R controller, can be used to create and/or modify a sampling plan.

The SVMP can require a wafer to visit a physical module X number of times, where X is an integer that is equal to or greater than zero, and the SVMP can require the wafer to skip a physical module Y number of times, where Y is an integer that is equal to or greater than zero. The process sequence can comprise N virtual modules, where ($N=X_{Max}+Y_{Max}$), and $X_{Max}$ is the maximum number of visits and $Y_{Max}$ is the maximum number of non-visits (skipped visits).

TABLE 1

| Virtual Module | Physical Module | Process Seq. # | | | | | | | |
|---|---|---|---|---|---|---|---|---|---|
| | | 1 | 2 | 3 | 4 | 5 | 6 | 7 | 8 |
| $VM_1$ | IM01(1) | X | X | X | X | X | X | X | X |
| $VM_2$ | PM01(1) | X | X | X | X | X | X | X | X |
| $VM_3$ | PM01(2) | X | X | X | X | | | | |
| $VM_4$ | IM01(2) | X | X | X | X | X | X | | |
| $VM_5$ | PM02(1) | X | X | X | X | | X | X | |
| $VM_6$ | PM02(2) | X | X | X | | | | | |
| $VM_7$ | IM01(3) | X | X | | X | | | | |
| $VM_8$ | IM02(1) | X | | | | | | | |

Table 1, depicted above, shows a number of different exemplary process sequences for eight virtual modules. In this example, the maximum number of visits to a first measurement module (IM01) is equal to three, the maximum number of visits to a second measurement module (IM02) is equal to one, the maximum number of visits to a first processing module (PM01) is equal to two, and the maximum number of visits to a second processing module (PM02) is equal to two. In alternate embodiments, the number of processing modules may be different, the number of measurement modules may be different, and the maximum number of visits may be different.

In process sequence #1, the actual number of visits a wafer can make to the first measurement module is equal to the maximum number allowable in this example. Similarly, the actual number of visits the wafer can make to the second measurement module is equal to the maximum number allowable in this example. Moreover, the actual number of visits the wafer can make to the first processing module is equal to the maximum number allowable in this example. Similarly, the actual number of visits the wafer can make to the second processing module is equal to the maximum number allowable in this example. This is not required for the invention. The process sequences shown can be applicable to one or more wafers.

In the first process sequence, the first virtual module $VM_1$ object can be associated with the first visit to a first measurement module IM01(1); the second virtual module $VM_2$ object can be associated with the first visit to a first processing module PM01(1); the third virtual module $VM_3$ object can be associated with the second visit to the first processing module PM01(2); the fourth virtual module $VM_4$ object can be associated with the second visit to the first measurement module IM01(2); the fifth virtual module $VM_5$ object can be associated with the first visit to a second processing module PM02(1); the sixth virtual module $VM_6$ object can be associated with the second visit to the second processing module PM02(2); the seventh virtual module $VM_7$ object can be associated with the third visit to the first measurement module IM01(3); and the eighth virtual module $VM_8$ object can be associated with a first visit to a second measurement module IM02(1).

As discussed above regarding the SVMP, a wafer can make one or more visits (e.g., multi-visit plan) to a physical module, and a wafer can skip one or more visits (e.g., sampling plan) to a physical module.

The first exemplary process sequence can occurred when the desired process result requires three visits to a first measurement module, two visits to a first processing module, two visits to a second processing module, and one visit to a second measurement module. The other process sequences can occur when the desired process result can be achieved with different combinations of process steps. Multiple visits to a processing module can be required when a desired process result cannot be achieved in a single pass through a processing module or set of processing modules. For example, a required etch amount, a required trim amount, or a required deposition amount may be larger than the amount that can be achieved by a single pass through a processing module. Multiple visits to a measurement module can occur when pre-process and/or post-process measurements are required.

Table 1 also illustrates examples of some other process sequences that may occur when the actual number of visits a wafer makes to a physical module is less than the maximum number allowable. The actual number of visits to a processing module can be equal to or greater than zero. For example, when a process, such as a trimming process or an etching process, is not required, the actual number of visits to a processing module can be zero. In addition, the actual number of visits to a measurement module can be equal to or greater than zero. For example, when a measurement process, such as a processing tool related measurement process or a host system related measurement process is not required, the actual number of visits to a measurement module can be zero.

In the second process sequence, the eighth virtual module $VM_8$ can be associated with the non-visit (skipped visit) to the second measurement module (IM02). In a process sequence that includes virtual module objects, a wafer is allowed to skip one or more visits to a physical module, and a "placeholder" virtual module can be established. When virtual modules are used as placeholders, a minimum amount of data is generated. For example, the database can comprise a virtual module name and a "null" identifier.

When a different number of visits to a physical may be required to achieve a desired process result for different wafers, the SVMP can be configured to use virtual modules to represent the different number of visits to the physical module. The number of virtual module objects required in a process sequence can be equal to the maximum number of visits required to one or more physical module. In an alternate embodiment, a multiple visit plan or a sampling plan may be used.

A visited virtual module (VVM) object can represent a single pass through (visit) a physical module. The maximum number of VVM objects is equal to the maximum number of passes through a physical module. In this case, the actual number of VVM objects is equal to the actual number of passes through one or more visited physical modules. VVM data, such as event data and measurement data, can be sent to the host system for the VVM objects.

A non-visited virtual module (NVVM) object can represent a non-visit (skipped visit) to a physical module. The maximum number of NVVM objects is equal to the maximum number of non-visits to a physical module. In this case, the actual number of NVVM objects is equal to the actual number of non-visits to one or more non-visited physical modules. NVVM data, such as event data and placeholder data can be uploaded to the host system for the NVVM objects.

TABLE 2

| Virtual Module | Physical Module | Wafer # | | | | | | | |
|---|---|---|---|---|---|---|---|---|---|
| | | 1 | 2 | 3 | 4 | 5 | 6 | 7 | 8 |
| $VM_1$ | IM01(1) | $VVM_1$ | $VVM_1$ | $VVM_1$ | $VVM_1$ | $VVM_1$ | $VVM_1$ | $VVM_1$ | $VVM_1$ |
| $VM_2$ | PM01(1) | $VVM_2$ | $VVM_2$ | $VVM_2$ | $VVM_2$ | $VVM_2$ | $VVM_2$ | $NVVM_1$ | $VVM_2$ |
| $VM_3$ | PM01(2) | $VVM_3$ | $VVM_3$ | $VVM_3$ | $VVM_3$ | $VVM_3$ | $NVVM_1$ | $NVVM_2$ | $NVVM_1$ |
| $VM_4$ | IM01(2) | $VVM_4$ | $VVM_4$ | $VVM_4$ | $NVVM_1$ | $VVM_4$ | $VVM_3$ | $NVVM_3$ | $NVVM_2$ |
| $VM_5$ | PM02(1) | $VVM_5$ | $VVM_5$ | $VVM_5$ | $VVM_4$ | $NVVM_1$ | $VVM_4$ | $VVM_2$ | $NVVM_3$ |
| $VM_6$ | PM02(2) | $VVM_6$ | $VVM_6$ | $VVM_6$ | $NVVM_2$ | $NVVM_2$ | $NVVM_2$ | $NVVM_4$ | $NVVM_4$ |

TABLE 2-continued

| Virtual Module | Physical Module | Wafer # | | | | | | | |
|---|---|---|---|---|---|---|---|---|---|
| | | 1 | 2 | 3 | 4 | 5 | 6 | 7 | 8 |
| $VM_7$ | IM01(3) | $VVM_7$ | $VVM_7$ | $NVVM_1$ | $VVM_5$ | $VVM_5$ | $NVVM_3$ | $NVVM_5$ | $NVVM_5$ |
| $VM_8$ | IM02(1) | $VVM_8$ | $NVVM_1$ | $NVVM_2$ | $NVVM_3$ | $VVM_6$ | $NVVM_4$ | $NVVM_6$ | $NVVM_6$ |

Table 2, illustrated above, shows the visited virtual module (VVM) objects and non-visited virtual module (NVVM) objects associated with the process sequences shown in Table 1. In this example, the maximum number of visits to a first measurement module (IM01) is equal to three, the maximum number of visits to a second measurement module (IM02) is equal to one, the maximum number of visits to a first processing module (PM01) is equal to two, and the maximum number of visits to a second processing module (PM02) is equal to two. The exemplary process sequence has a length equal to eight (e.g., 3+1+2+2=8). In alternate embodiments, the number of processing modules may be different, the number of measurement modules may be different, and the maximum number of visits may be different.

In the example represented in Table 2, the actual number of visited virtual module (VVM) objects associated with wafer #1 is equal to the actual number of visits wafer #1 makes to the first measurement module plus the actual number of visits wafer #1 makes to the second measurement module plus the actual number of visits wafer #1 makes to the first processing module plus the actual number of visits wafer #1 makes to the second processing module in this example. This is not required for the invention. The process sequence shown for wafer #1 can be applicable to one or more wafers.

Table 2 also illustrates examples of other process sequences that may occur when the actual number of visits a wafer makes to a module is less than the maximum number allowable. The number of non-visits can be equal to the maximum number of visits minus the actual number of visits to a physical module, and the number of non-visited virtual module (NVVM) objects can be equal to the maximum number of visits minus the actual number of visits to a physical module. For example, when a physical process is not required, the actual number of non-visits to a physical module can be equal to the maximum number of allowable visits.

In this example, the number of VVM objects associated with a wafer is equal to the actual number of visits the wafer makes to a physical module, and the number of NVVM objects associated with a wafer is equal to the actual number of non-visits the wafer makes to a physical module.

In one embodiment, a measurement module can be controlled using a sample plan that is wafer-dependent and determined by the Process Job. With a sample plan, the system recipe can be configured with a wafer route with the maximum number of measurement module visits needed and then use the same system recipe for different measurement module samplings. Measurement module data can be sent to a Control Plan or a Feedback Plan.

Returning to FIG. 8, wafer-based procedure 800 executes the process sequence in task 830. It will be appreciated that one or more processing system controllers, such as a R2R controller, can be used to execute the process sequence. In one embodiment, the process sequence comprises N virtual module objects and can be written as ($VM_1$, $VM_2$, $-VM_N$).

The process sequence can include a first number of VVM objects and a second number of NVVM objects.

The processing system controller can contain a number of APC Recipes (Control Strategies) for controlling the operation of the system, a Control Strategy can be associated with a system recipe. Control Strategies can contain Control Plans, and a physical module under control can have at least one Control Plan defined for a visit to the physical module. Control Plans may contain models, limits, targets, and can cover multiple process steps within a module. In one embodiment, a virtual control strategy and/or plan can be established and mapped to a physical module. Control strategies and/or plans can be established when a Process Job (PJ) is received and/or created.

The processing system controller can additionally execute a visited virtual module (VVM) data collection (DC) strategy, the VVM data collection (DC) strategy comprising at least one visited virtual module (VVM) data collection (DC) plan. The VVM DC strategy selection and initiation can also be context-based. When a VVM DC strategy is executed, VVM data can be collected for a wafer that is being processed in a physical module.

A DC plan determines which data is collected, how the data is collected, and where the data is stored. The process system controller can auto-generate data collection plans for virtual modules. Typically, one data collection plan can be active at a time for a specific module, and the controller can select and use a data collection plan that matches the wafer context. Data can include trace data, process log information, recipe data, maintenance counter data, OES data, VIP data, or analog data, or a combination of two or more thereof. Measurement devices and/or sensors can be started and stopped by a DC plan. A DC plan can also provide information for trimming data, clipping data, and dealing with spike data and outliers.

Furthermore, the processing system controller can execute a visited virtual module (VVM) analysis strategy when a VVM object in the process sequence is executed. The VVM analysis strategy can comprise a visited virtual module (VVM) analysis plan, or a visited virtual module (VVM) judgment plan, or a combination thereof. When a VVM analysis strategy is executed, wafer data, process data, and/or module data can be analyzed, and fault conditions can be identified.

For example, after the data has been collected, the data can be sent to a Statistical Process Control (SPC) program for run-rule evaluation. SPC limits can be calculated automatically based on historical data or entered manually based on the customer's experience or process knowledge, or obtained from a host computer. SPC charts can be automatically generated by the controller for the virtual modules.

The data can be compared with the warning and control limits, and when a run-rule is violated, an SPC alarm can be generated that indicates the process has exceeded statistical limits. When an alarm is generated, the process system controller can perform either notification or intervention.

Notification can be via e-mail or by an e-mail activated pager. In addition, the process system controller can intervene by either pausing the process at the end of the current lot or pausing the process at the end of the current wafer. The process system controller can identify the virtual module that caused the alarm to be generated.

In one embodiment, the processing system controller can determine a process recipe for each VVM object in the process sequence. Alternately, process recipes can be determined, sent, and/or verified by the host system.

The processing system controller can also execute a non-visited virtual module (NVVM) control strategy when a virtual module in the process sequence is associated with a non-visit to a physical module. The non-visited virtual module (NVVM) control strategy can comprise one or more non-visited virtual module (NVVM) control plans. A non-visited virtual module (NVVM) data collection (DC) strategy can also be executed, and the NVVM data collection (DC) strategy can comprise one or more non-visited virtual module (NVVM) data collection (DC) plans for collecting NVVM data.

When a NVVM control strategy is executed, a wafer is not processed in a physical module. When a NVVM DC strategy is executed, NVVM data can be collected for a wafer.

In one embodiment, a processing system controller can be used to determine a "null" recipe for each NVVM object in the process sequence. For example, a "null" recipe can be used to move a wafer into a physical module as a "holding" type of operation. Alternately, a "null" recipe can be used to move a wafer to a temporary storage point, such as a transfer module, a loading module, a storing module, a heating module, or a cooling module.

When a NVVM object is executed, the process system controller can create a data file having a minimum amount of data. A NVVM object can occur when a wafer does not require one or more processing steps in one of the physical modules. A process system controller can leave the wafer in its current location or move it to a holding location during the execution of a NVVM object. Alternately, a "null" recipe can be used to move a wafer to a temporary storage point, such as a transfer module, a loading module, a storing module, a heating module, or a cooling module.

When virtual modules are used as placeholders, a minimum amount of data is generated. For example, the data file can comprise a virtual module name and a "null" identifier.

In task 840, a wafer-based procedure 800 collects the data. In particular, a processing system controller can collect visited virtual module (VVM) data when a virtual module object in the process sequence is associated with an actual pass through a physical module. Also, a processing system controller can collect non-visited virtual module (NVVM) data when a virtual module in the process sequence is associated with a non-visit to a physical module. The VVM data and the NVVM data can be stored in a database associated with the processing system.

In one embodiment, a processing system controller can send the visited virtual module (VVM) data, or the non-visited virtual module (NVVM) data, or a combination thereof to the host system. In addition, the VVM data and the NVVM data can be stored in a database associated with the host system.

After the VVM and NVVM data are collected, procedure 800 may issue a query as indicated by task 850, to determine whether another wafer requires processing. If so, procedure 800 branches back to task 830 to continue the process sequence as shown in FIG. 8. When another wafer does not require processing, procedure 800 branches to task to terminate the procedure.

Figure 9:
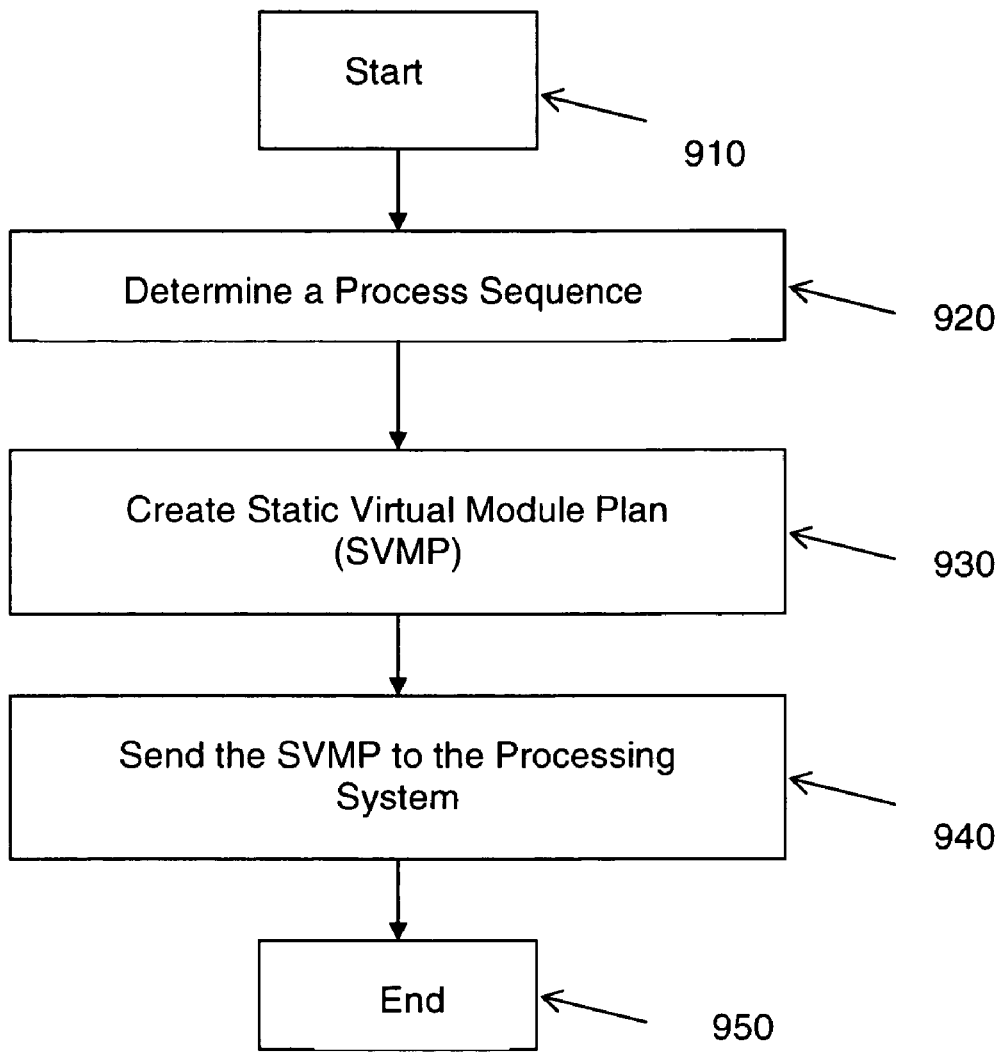
FIG. 9 shows a flow diagram for a method of operating a host system controller in accordance with another embodiment of the invention.

FIG. 9 shows a flow diagram for a method of operating a host system controller, in accordance with another embodiment of the invention. In the illustrated embodiment, a wafer-based procedure 900 is shown, but this is not required for the invention. Alternately, the procedure can be lot-based or batch-based. Procedure 900 starts in task 910 where, for example, a start event can be a wafer-in event, a lot-start event, or a batch start event, or an end event from another process.

In task 920, the host controller determines a required process sequence using the desired process result for a wafer. Upon determining the process sequence, the host controller, in task 930, can create a static virtual module plan (SVMP). The SVMP may comprise the process sequence, process sequence length (N), the number of VVM objects ($N_{act}$), the number of NVVM objects ($N_{non}$), the maximum number of passes ($N_{max}$) through each physical module, or a combination of two or more thereof.

The host controller can determine an actual number of passes ($N_{act}$) through a physical module the wafer actually uses to achieve the desired process result, and can establish a VVM object for each actual pass the wafer makes through a physical module. In addition, the host controller can determine an actual number of non-visits ($N_{act}$) to a physical module the wafer actually uses to achieve the desired process result, and can establish a NVVM object for each non-visit (skipped visit) associated with a wafer. The host controller can also determine a maximum number of passes ($N_{max}$) through each physical module a wafer can use to achieve the desired process result. In addition, the host controller can determine a process sequence length (N) for the wafer, wherein the process sequence length (N) is equal to a sum of the maximum number of visits and non-visits associated with each physical module. Moreover, a host controller can determine a number of visits ($N_{act}$) to the physical modules associated with the wafer, where ($N_{act}$) is an integer equal to or larger than zero, and can establish a visited virtual module (VVM) object for each visit ($N_{act}$) to a physical module associated with the wafer. In addition, the host controller can determine a number of non-visits ($N_{non}$) to the physical modules associated with the wafer, wherein ($N_{non}=N_{max}-N_{act}$) and ($N_{non}$) is an integer equal to or larger than zero, and can establish a non-visited virtual module (NVVM) object for each non-visit ($N_{non}$) to a physical module associated with the wafer. In addition, the host controller can determine a process sequence comprising ($N_{act}$) VVM objects, and ($N_{non}$) NVVM objects, and each VVM object in the process sequence can be associated with an actual pass through a physical module, and each NVVM object in the process sequence is associated with a non-visit to a physical module.

After creating the SVMP, the host sends the SVMP to the processing system, as indicated in task 940. Procedure 900 may terminate in task 950.

When the processing system executes the SVMP, the processing system can exchange data with the host system. For example, the host system can receive visited virtual module (VVM) data when the processing system executes the process sequence and a VVM object is executed. Additionally, the host system can receive non-visited virtual module (NVVM) data when the processing system executes the process sequence and a NVVM object is executed.

In one embodiment, a host controller can determine a process recipe for each VVM object in the process sequence and can send the process recipe for each VVM object in the process sequence to the processing system. The host controller can determine a process recipe for each NVVM object in the process sequence, and the host controller can send the process recipe for each NVVM object in the process sequence to the processing system.

The host controller can also determine the desired process result and the desired process result can comprise a trim amount, an etch amount, or a deposition amount, or a combination of two or more thereof.

When the semiconductor processing system includes a host system and one or more processing systems, the host system and the processing system can operate together to control and/or monitor the processing operations. The processing system in concert with the host system can create a dynamic virtual module plan (DVMP) that includes a process sequence, and the processing system controller can send the DVMP to the host system. In one embodiment, the process sequence can comprise a sequence of virtual module (VM) objects.

Figure 10:
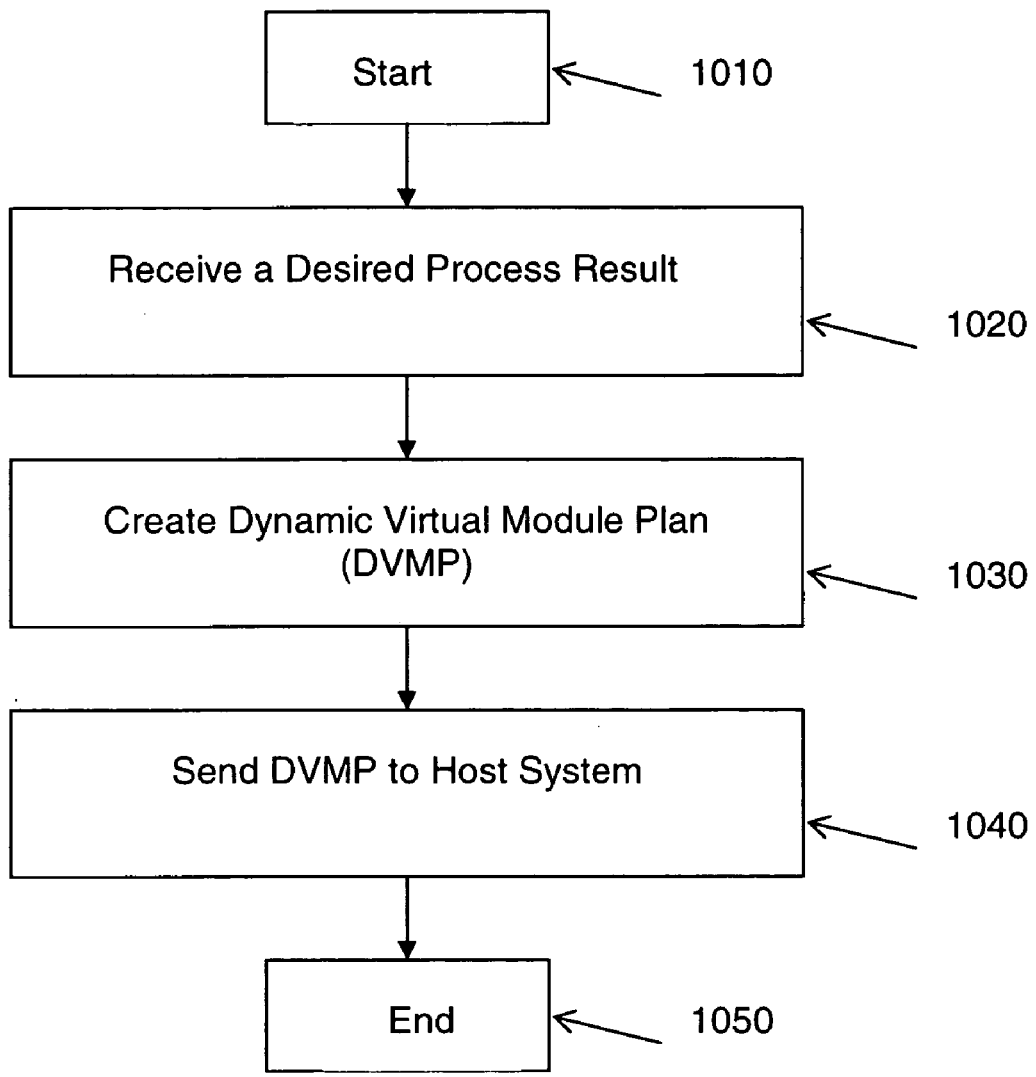
FIG. 10 shows a flow diagram for a method of operating a processing system controller in accordance with another embodiment of the invention.

FIG. 10 shows a flow diagram for a method of operating a processing system controller, in accordance with another embodiment of the invention. In the illustrated embodiment, a wafer-based procedure 1000 is shown, but this is not required for the invention. Alternately, the procedure can be lot-based or batch-based. Procedure 1000 starts in task 1010. For example, a start event can be a wafer-in event, a lot-start event, or a batch start event, or an end event from another process.

In task 1020, a processing system controller may receive a desired process result from the host system. The desired process result may comprise a trim amount, an etch amount, or a deposition amount, or a combination of two or more thereof.

In one embodiment, the processing system and the host system co-operate to determine the correct process sequence to use to process a wafer. For example, in a trimming process, such as a COR process, some of the wafers may require no passes through the COR modules, some wafers may require one pass through the COR modules, and other wafers may require more than one pass through the COR modules. In this case, the host system allows the processing system to determine the number of passes through the COR modules and virtual modules. The number of passes can be established to manage the different number of process objects in the process sequences for the different wafers.

Based on the desired process results received from the host system, the processing system controller creates a dynamic virtual module plan (DVMP) for a wafer, as indicated in task 1030, using the received desired result. In one embodiment, the DVMP may comprise the desired process result for the wafer, an actual number of passes ($N_{act}$) through a physical module the wafer may use to achieve the desired process result, a maximum number of passes ($N_{max}$) through a physical module the wafer may use to achieve the desired process result, a process sequence, and a process sequence length (N) for the wafer. The process sequence length (N) may be equal to the maximum number of passes ($N_{max}$) through the physical module. The process sequence may include $N_{non}$ virtual module objects, and a visited virtual module (VVM) object in the process sequence may be associated with an actual pass through a physical module, and a non-visited virtual module (NVVM) object may be associated with a non-visit to a physical module.

In task 1040, the processing system controller sends the DVMP to the host system.

When the process sequence has been determined, the processing system controller can execute the process sequence, and the process sequence can comprise N virtual module objects and can include a VVM object, or a NVVM object, or a combination thereof. Visited virtual module (VVM) data can be collected when a VVM object in the process sequence is executed, and non-visited virtual module (NVVM) data can be collected when a NVVM object in the process sequence is executed. The processing system controller can send the visited virtual module (VVM) data, or the non-visited virtual module (NVVM) data, or a combination thereof to the host system. In addition, the VVM data and/or the NVVM data can be stored in a database associated with the processing system and/or the host system.

Procedure 1000 may terminate in task 1050.

The processing system controller can execute a visited virtual module (VVM) control strategy when a VVM object in the process sequence is executed. The VVM control strategy can include one or more visited virtual module (VVM) control plans. The VVM control strategy selection and initiation can be context-based. When a VVM control strategy is executed, a wafer can be processed in a physical module.

In addition, the processing system controller can execute a visited virtual module (VVM) data collection (DC) strategy, the VVM data collection (DC) strategy comprising at least one visited virtual module (VVM) data collection (DC) plan. The VVM DC strategy selection and initiation can also be context-based. When a VVM DC strategy is executed, VVM data can be collected for a wafer that is being processed in a physical module.

Furthermore, the processing system controller can execute a visited virtual module (VVM) analysis strategy when a VVM object in the process sequence is executed. The VVM analysis strategy can comprise a visited virtual module (VVM) analysis plan, or a visited virtual module (VVM) judgment plan, or a combination thereof. When a VVM analysis strategy is executed, wafer data, process data, and/or module data can be analyzed, and fault conditions can be identified.

In one embodiment, the processing system controller can determine a process recipe for each VVM object in the process sequence. Alternately, process recipes can be determined, sent, and/or verified by the host system.

The processing system controller can also execute a non-visited virtual module (NVVM) control strategy when a virtual module in the process sequence is associated with a non-visit to a physical module. The non-visited virtual module (NVVM) control strategy can comprise one or more non-visited virtual module (NVVM) control plans. A non-visited virtual module (NVVM) data collection (DC) strategy can also be executed, and the NVVM data collection (DC) strategy can comprise one or more non-visited virtual module (NVVM) data collection (DC) plans for collecting NVVM data.

When a NVVM control strategy is executed, a wafer is not processed in a physical module. When a NVVM DC strategy is executed, NVVM data can be collected for a wafer.

In one embodiment, a processing system controller can be used to determine a "null" recipe for each NVVM object in the process sequence. For example, a "null" recipe can be used to move a wafer into a physical module as a "holding" type of operation. Alternately, a "null" recipe can be used to move a wafer to a temporary storage point, such as a transfer module, a loading module, a storing module, a heating module, or a cooling module.

In one embodiment, a processing system controller can receive a process recipe for one or more virtual module objects in the process sequence. For example, the host system may require a specific process recipe to be performed by a physical module. In addition, the host system may require a specific set of process steps for a "sampled" wafer. For example, a wafer may be sent to an external measurement module.

The processing module can comprise an etch module, a deposition module, a chemical oxide removal (COR) module, a heating module, a transfer module, a cooling module, or a development module, or a combination of two or more thereof. The measurement modules can include an optical measurement module, an optical digital profile (ODP) module, a SEM module, or a TEM module, or combination of two or more thereof.

When the semiconductor processing system includes a host system and one or more processing systems, the host system and the processing system can operate together to control and/or monitor the processing operations. The processing system in concert with the host system can create a dynamic virtual module plan (DVMP) that includes a process sequence. The processing system controller can send the DVMP to the host system, and the host system can execute the DVMP. In one embodiment, the process sequence can comprise a sequence of virtual module (VM) objects.

Figure 11:
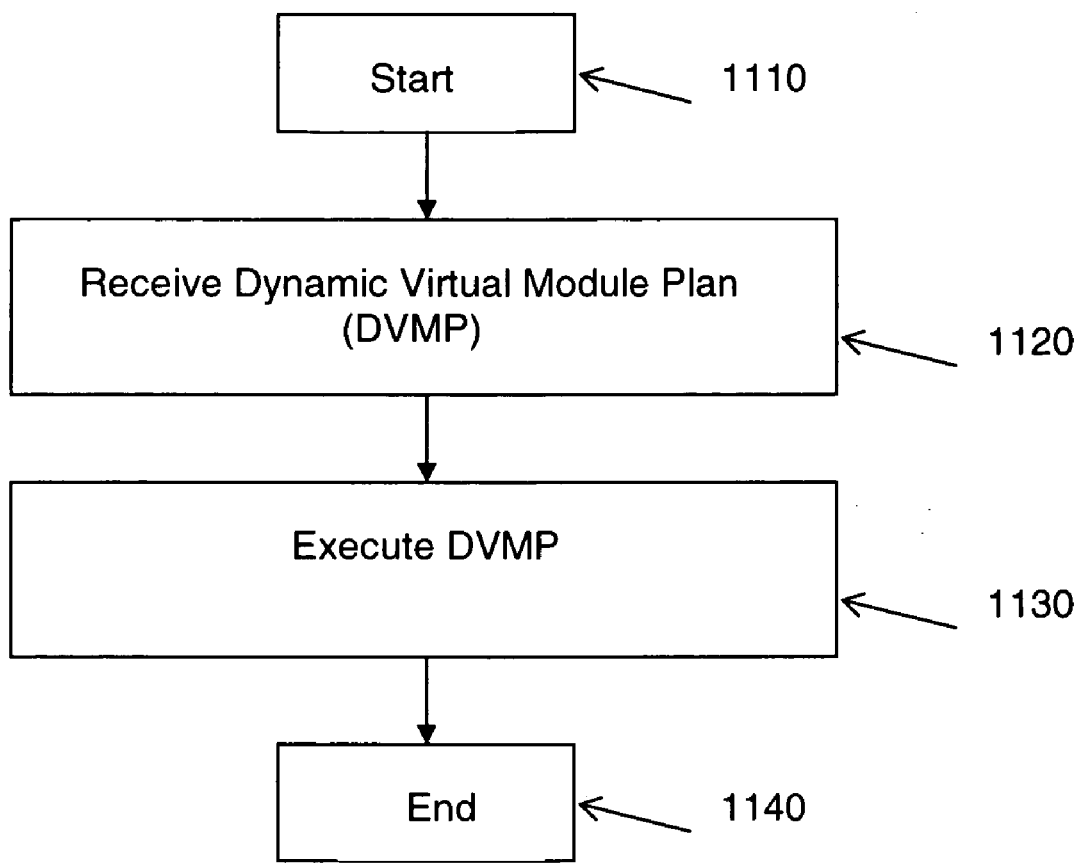
FIG. 11 shows a flow diagram for a method of operating a host system controller in accordance with another embodiment of the invention.

FIG. 11 shows a flow diagram for a method of operating a processing system controller in accordance with another embodiment of the invention. In the illustrated embodiment, a wafer-based procedure 1100 is shown, but this is not required for the invention. Alternately, the procedure can be lot-based or batch-based. Procedure 1100 starts in task 1110 where a start event can be, for example, a wafer-in event, a lot-start event, or a batch start event, or an end event from another process.

In task 1120, a host controller receives a dynamic virtual module plan (DVMP) from the processing system. The DVMP comprises a desired process result for the wafer, an actual number of passes ($N_{act}$) through a physical module the wafer can use to achieve the desired process result, a maximum number of passes ($N_{max}$) through a physical module the wafer can use to achieve the desired process result, a process sequence, and a process sequence length (N) for the wafer. The process sequence length (N) can be equal to the maximum number of passes ($N_{max}$) through the physical module. The process sequence can have N virtual module objects. The process sequence can include a visited virtual module (VVM) object for each virtual module object in the process sequence associated with an actual pass through a physical module, and can include a non-visited virtual module (NVVM) object for each virtual module object in the process sequence associated with a non-visit to a physical module.

Upon receiving the DVMP, the host controller executes the DVMP in task 1130. In task 1140, procedure 1100 can end.

In one embodiment, the host controller can receive visited virtual module (VVM) data when the processing system executes the process sequence and a VVM object is executed and can receive non-visited virtual module (NVVM) data when the processing system executes the process sequence and a NVVM object is executed.

The host controller can determine and/or verify a process recipe for at least one visited virtual module (VVM) object in the process sequence, and can send a the process recipe for one or more visited virtual module (VVM) objects in the process sequence to a database.

The host controller can determine and/or verify a process recipe for at least one non-visited virtual module (NVVM) object in the process sequence, and can send a the process recipe for one or more non-visited virtual module (NVVM) objects in the process sequence to a database.

In one embodiment, a visited virtual module (VVM) data object can be established for each actual pass the wafer makes through the physical module; a non-visited virtual module (NVVM) data object can be established for each non-visit ($N_{non}$) to the physical module associated with the wafer.

When the semiconductor processing system includes a host system and one or more processing systems, the host system can operate as the master system and can control and/or monitor a major portion of the processing operations. The host system can create a static virtual module plan (SVMP) that includes a process sequence, and can send the SVMP to the processing system. In one embodiment, the process sequence can comprise a sequence of physical module (PM) and virtual module (VM) objects.

A SVMP and/or DVMP can be wafer dependent, that is some wafers will require multiple visits to a physical module; other wafers will require a single visit to a physical module; and still other wafers will require zero visits to a physical module.

Figure 12:
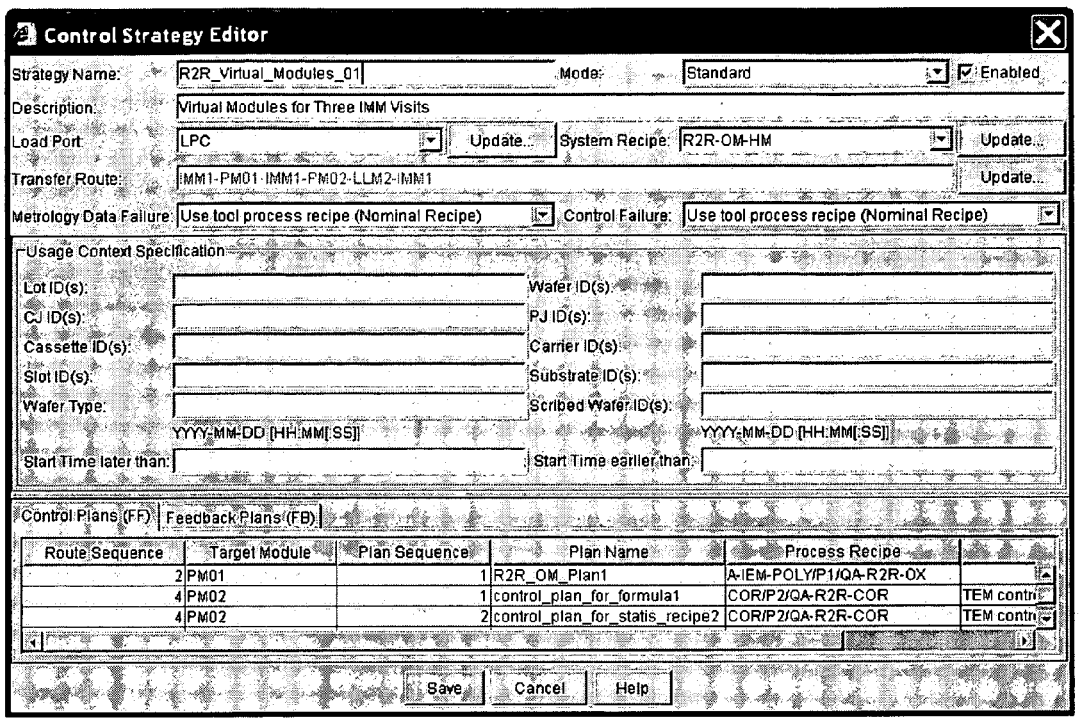
FIG. 12 illustrates an exemplary view of a virtual module (VM) Control Strategy Screen in accordance with an embodiment of the invention.

FIG. 12 illustrates an exemplary view of a virtual module (VM) Control Strategy Screen, in accordance with an embodiment of the invention. A VM Control Strategy Screen can comprise a number of configuration items. The Strategy Name field can be used enter/edit a VM Control Strategy name. A Description field can be used to enter/edit a VM Control Strategy Description. The mode field can be used to enter/edit a mode for the VM Control Strategy. For example, modes can include a standard mode and a simulation mode. An Enabled box can be used enable or disable a VM Control Strategy A Load Port field can be used to obtain a list of load port information from the processing tool. A Load Port Update Button can be used as a refresh function, and can be used to obtain the current load port information from the processing tool.

A System Recipe field can be used to obtain a list of system recipes from the processing tool. A System Recipe Update button can be used as a refresh function, and can be used to obtain the current recipe information from the processing tool. For example, the system recipe name can be used to trigger the VM control strategy by matching one or more context items such as the system recipe name.

A Transfer Route field can be used to obtain the transfer route for selected load port and system recipe from the processing tool. A Transfer Route Update button can be used as a refresh function, and can be used to obtain the current recipe information from the processing tool.

A Transfer Route field can be used to obtain the transfer route for selected load port and system recipe from the processing tool. For example, a transfer route can be used to determine when a wafer is transferred into an integrated metrology module (IMM), and when a wafer is being processed in a process module (PMxx). A Description field can be used to provide a description for the VM model.

The transfer route can show that the wafers go to an IM module for a pre-process measurement and post process measurements. During a VM process, one or more integrated metrology modules (IMM) can be used. In the illustrated embodiment, the transfer route shows a six-step process (IMM1-PM01-IMM1-PM02-LLM2-IMM1), but this is not required for the invention. In alternate embodiments, different transfer routes may be used, and different modules may be used. Alternately, virtual module names may be shown.

The Metrology Data Failure field can be used to enter/edit the metrology data failure action from the following options: Use Tool Process Recipe (Nominal Recipe)—the software sends the indication to the process tool and the process tool uses the tool process recipe. Do Not Use Process Recipe ("null" Recipe)—The software sends the "null" recipe information associated with the wafer to the process tool and the wafer goes in and out of the chamber without being processed. PM Pause—Pauses the process module, and System Pause—Pauses the system including transfer system.

The Control Failure field can be used to enter/edit the Control Failure option from the following options: Use Tool Process Recipe (Nominal Recipe)—the software sends the indication to the process tool and the process tool uses the tool process recipe. Do Not Use Process Recipe ("null" Recipe)—The software sends the "null" recipe information associated with the wafer to the process tool and the wafer goes in and out of the chamber without being processed. PM Pause—Pauses the process module, and System Pause—Pauses the system including transfer system.

A tool level and/or system level controller can detect control failures. If control failure occurs, the system can be configured to use the tool process recipe (nominal recipe), use the "null" recipe, or to stop the VM process, or to pause the process module, or to pause the entire system.

In addition, a number of Usage Context Specification fields can be used to provide additional context matching items when these additional context items are required. A LotID(s) field can be used to enter/edit the lot identifiers; a Wafer ID(s) field can be used to enter/edit the wafer identifiers; a CJID(s) field can be used to enter/edit the control job identifiers; a PJID(s) field can be used to enter/edit the process job identifiers; a Cassette ID(s) field can be used to enter/edit the cassette identifiers; a Carrier ID(s) field can be used to enter/edit the carrier identifiers; a Slot(s) field can be used to enter/edit the slot numbers; a Substrate ID(s) field can be used to enter/edit the substrate identifiers; a Wafer Type(s) field can be used to enter/edit the wafer types; a Scribed Wafer ID(s) field can be used to enter/edit the scribed wafer identifiers; one Start Time field can be used to enter/edit the start time; and a second Start Time field can be used to enter/edit the end time.

As shown in FIG. 12, a VM Control Strategy can comprise one or more VM control plans. Using a Control Strategy Screen, a user can perform a VM Control Strategy configuration, view an existing VM Control Strategy, create a new VM Control Strategy, copy an existing VM Control Strategy, edit an existing VM Control Strategy, delete an existing VM Control Strategy, and test a VM Control Strategy. For example, a dropdown list can be used to select a course of action.

Figure 13:
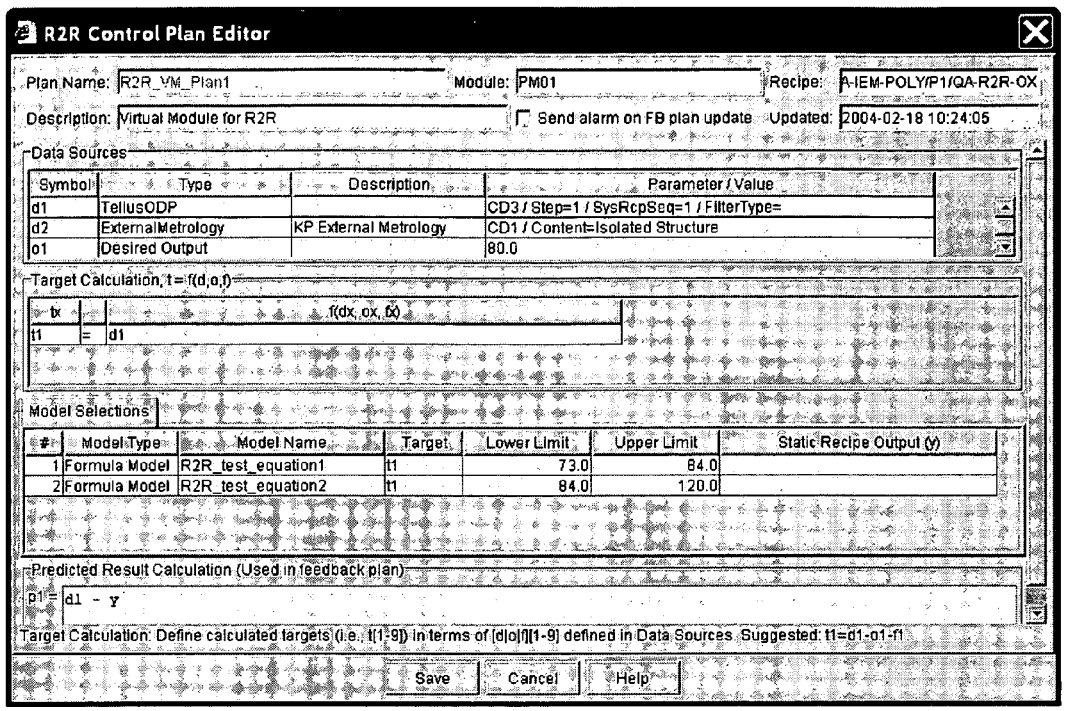
FIG. 13 illustrates an exemplary view of virtual module (VM) Control Plan Screen in accordance with an embodiment of the invention.

FIG. 13 illustrates an exemplary view of Control Plan Editor Screen in accordance with an embodiment of the invention. In FIG. 13, a VM Control Plan screen is shown for a control plan for managing a virtual module that can comprise a process module (PM01). Alternately, other modules can be used, such as other process modules (PMxx) and measurement modules (IMyy).

To create a VM Control Plan, a user can select the plan name item and select a new Control Plan or an existing plan or model. For example, on a VM Control Strategy screen, a drop-down menu can appear and the Add Plan selection can be chosen.

A VM Control Plan screen can comprise a number of fields. The Plan Name field can be used to enter/edit a name for a VM control plan. A Module field can be used to enter/edit a module name. For example, if the plan is associated with a strategy, the module field may be automatically filled in. If the plan is unassociated, the module field can be used to select a process module or a measurement module. The Recipe field can be used to enter/edit a recipe. For example, if the plan is associated with a strategy, the recipe field may be automatically filled in. If the plan is unassociated, the field can be used to select a process recipe for a process module or a measurement recipe for a measurement module.

The Description field can be used to enter/edit a description for the plan. The Updated field displays the last time the plan was changed.

The Data Sources table can be used to enter/edit a data source. For example, a VM Plan Data Source screen may be opened. The Data source table can include a source type, a data source description, and a data source parameter/value. For example, the selected source type determines the options displayed on the Data Source screen; a "Telius ODP" type can be used to define integrated metrology module data sources that are part of the processing tool; a "Desired Output" type allows the user to enter a fixed unit for the controller; a "Feedback Offset" type allows the user to define a persistent feedback variable; a "Control Plan Value" allows the user to create a variable that references the results of a different control plan (creates nested plans); the "Integrated Metrology Site Filtering" type creates tables with descriptions of each option when each data source is selected; and a "ContextItem" type allows a user to create a variable that references a context item, such as a Slot_Id, a Wafer_id, or a wafer number.

The symbol can be selected from the Symbol drop-down list, and a source type can be selected from the Data Source Type drop-down menu. For example, the data source information fields can vary depending on the chosen data source.

One input data source (d1) is shown, but this is not required. A different number of input data sources can be used, and each input data source can have a different symbol value. For example, one data source can be an ODP tool, and it can be part of the processing tool, such as a Telius. In addition, another data source can be a SEM, and the Parameter/Value can be actual measured data such as a CD-SEM data.

In general, process control can include updating a process module recipe using metrology information measured on the wafer prior to its arrival in the process module. The controller can use the pre-processing data to determine how many visits are required to the various physical modules. The desired process result can be a "y" value in a model equation. The task is determine when the desired process result "y" is the correct value.

In the target calculation field, on a VM Control Plan screen, the target calculation can be entered. For example, the target calculation can be set equal to the data source item. Alternately, an equation may be entered that correlates one set of data with another set of data. In addition, target calculation may comprise an additional compensation term. For example, the additional compensation factor can be used to correct for errors introduced in another step, such as a gate stack etch step. A new target value can be a variable that is calculated at or before run time, and an equation can be used to calculate the target value.

In addition, new lower and upper limit values can be used, and these values can be entered in the lower limit field and upper limit field. For example, the new lower and upper limit values can be constants or variables that are calculated at or before run time, and equations can be used to calculate the new lower and upper limit values.

The Model Selections field can be used to edit/enter a static model and/or a formula model. For example, under the model type selection item, a selection item in the table can be used to enter and/or edit a model type. A drop down list can be activated from the table item and a selection can be made from the drop down list. One option in the drop down list allows a new model to be created; other options can be used to display and select existing models to use or to modify. Each model type can have a module name, target value, lower limit, upper limit, and recipe output associated with it. When creating a new model, a new model type can be used and entered in the model type field, and a new model name can be used and entered in the model name field.

The Predicted Result Calculation field can be used to enter a new predicted result value or select an existing predicted result value. The predicted result value can be an equation for the expected result. For example, a Control Plan can be saved when Name, Target Calculation, and Model Selection information is entered.

The # field comprises a number of the model in the list of models. The model type allows either a Static or a Formula model to be selected. The Model Name field lists the names of available models. For example, to create a new model, a "New Static Recipe" option or a "New Formula Recipe" option can be selected from a drop down list. A static control plan can be created that comprises one or more static recipes. For example, ten or more static models can be shown. The static models are shown with the same target value (t1), but this is not required. A different number of static and/or formula models can be used, and each model can have a different target value. A new target value can be calculated when each static recipe is used. As shown in FIG. 13, the static recipe models can have different operating ranges as defined by the lower limit values and the upper limit values. In addition, the static recipe models can have different static recipe outputs, and a different static recipe output can be determined for each static recipe.

The virtual module control plan can include a static model recipe, or a formula model recipe, or a combination thereof. The controller can auto-generate control plans for virtual modules. A process recipe can comprise one or more processes each comprising one or more processing steps. The process recipe can be performed in a single chamber or multiple chambers. The process recipe can be configured using at least one of a nominal recipe, a static recipe, and a formula model.

A static recipe can be a single set of recipe adjustments that are used to achieve a specific process result. A set of static recipes can be used to set up a table-based controller, or static recipes can be used along with formula models to treat ranges of the desired output where the same recipe should be used. When using feedback with static recipes, a single predicted process result can be specified in the control plan for each static recipe used. A formula model can comprise a pre-model adjustment, a model equation, a series of post model adjustments, and a recipe parameter assignment map. The pre-model adjustment can allow the re-expression of the desired process result (usually t1) into the correct units that are used in a model equation (resulting in a value of y), and the model equation can be an expression that calculates the predicted process result as a function of one manipulated variable (x). When the model is executed, it will solve for x given the re-expressed desired process result (y). Once x is determined, the post model adjustments can be calculated, and their values will be assigned to the appropriate recipe parameters specified in the recipe parameter map.

In addition, one or more process models can be provided. A process model can be used to define a process space. A process model represents the verified relationship between the desired results (outputs) and the received variables needed to achieve those results. Process models can include equations that can include formula-based models. Formula-based models can comprise equations that contain the piecewise associations of desired results with recipe variables based on some evaluated experimental data. A process model can be linear or non-linear. A process model can be used to verify a new process recipe, and update an existing process recipe.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating a processing system controller in a semiconductor processing system including a host system and a processing system, the method comprising:
   receiving a static virtual module plan that comprises a desired process result for at least one wafer, a process sequence for at least one wafer, the process sequence comprising a plurality of virtual module objects, wherein the plurality of virtual module objects comprise visited virtual module objects associated with a visit by a wafer to a physical module, and/or non-visited virtual module objects, associated with a non-visit by a wafer to a physical module;
   executing the process sequence;
   collecting visited virtual module data when a visited virtual module object in the process sequence is executed; and
   collecting non-visited virtual module data when a non-visited virtual module object in the process sequence is executed.

2. The method of claim 1, further comprising:
   sending the visited virtual module data and the non-visited virtual module data to the host system.

3. The method claim 1, further comprising:
   executing a visited virtual module control strategy when a visited virtual module object in the process sequence is executed, wherein the visited virtual module control strategy comprises one or more visited virtual module control plans; and
   executing a visited virtual module data collection strategy, wherein the visited virtual module data collection strategy comprises at least one visited virtual module data collection plan.

4. The method of claim 3, further comprising:
   executing a visited virtual module analysis strategy when a visited virtual module object in the process sequence is executed, wherein the visited virtual module analysis strategy comprises a visited virtual module analysis plan and/or a visited virtual module judgment plan.

5. The method of claim 3, further comprising:
determining a process recipe for each of the visited virtual module objects in the process sequence; and
determining a process recipe for each of the non-visited virtual module objects in the process sequence.

6. The method claim 1, further comprising:
executing a non-visited virtual module control strategy whe non-visited virtual module object in the process sequence is executed, wherein the non-visited virtual module control strategy comprises one or more non-visited virtual module control plans; and
executing non-visited virtual module data collection strategy wherein the non-visited virtual module data collection strategy comprises at least one non-visited virtual module data collection plan for collecting virtual module non-visit data.

7. The method of claim 1, further comprising:
receiving a process recipe for each of the visited virtual mod objects in the process sequence; and
receiving a process recipe for each of the non-visited virtual module objects in the process sequence.

8. The method of claim 1, wherein the desired process result comprises at least one of a trim amount, an etch amount, and a deposition amount.

9. The method of claim 1, wherein the physical module comprises a processing module, a measurement module, a transfer module, and/or holding module.

10. The method of claim 9, wherein the processing module comprises an etch module, a deposition module, a chemical oxide removal module a heating module, a transfer module, a cooling module, and/or a development module.

11. The method of claim 9, wherein the measurement module comprises an optical emissions spectrum module, a scanning electron microscope module, a optical digital profile module, and/or a transmission electron microscopy module.

12. A method of operating a host controller in a semiconductor processing system that includes a host system and a processing system, the method comprising:
creating a static virtual module plan that comprise a desired process result for at least one wafer, a process sequence for at least one wafer, the process sequence comprising a plurality of virtual module objects comprising visited virtual module objects, associated with a visit by a wafer to a physical module and/or non-visited virtual module objects, associated with a non-visit by a wafer to a physical module; and
sending the static virtual module plan to the processing system.

13. The method of claim 12, further comprising:
determining a desired process result for a wafer;
determining an actual number of visits to one or more physical modules the wafer uses to achieve the desired process result;
establishing a visited virtual module object for each visit;
determining a number of non-visits to a physical module the wafer uses to achieve the desired process result;
establishing a non-visited virtual module object for each non-visit; and
determining a process sequence length for the wafer, wherein the process sequence length is equal to a sum of the number of visits and number of non-visits.

14. The method of claim 12, further comprising:
determining a maximum number of visits to one or more physical modules the wafer can use to achieve the desired process result, wherein the maximum number of visits is an integer equal to or larger than zero; and
determining a process sequence length for the wafer, where the process sequence length is equal to the maximum number of visits.

15. The method of claim 14, further comprising:
determining a number of visits to each physical module the wafer actually uses to achieve the desired process result;
establishing a visited virtual module object for each visit;
determining a number of non-visits to a physical module the wafer actually uses to achieve the desired process result, wherein the number of non-visit an integer equal to or larger than zero; and
establishing a non-visited virtual module object for each non-visit.

16. The method of claim 12, further comprising:
receiving visited virtual module data when the processing system executes the process sequence and a visited virtual module object is executed; an
receiving non-visited virtual module data when the processing system executes the process sequence and a non-visited virtual module object is executed.

17. The method of claim 12, further comprising:
determining a process recipe for each visited virtual module object in the process sequence; and
sending the process recipe for each visited virtual module object in the process sequence to the processing system.

18. The method of claim 12, further comprising:
determining a process recipe for each non-visited virtual module object in the process sequence; and
sending the process recipe for each non-visited virtual module object in the process sequence to the processing system.

19. The method of claim 12, wherein the physical module comprises a processing module, a measurement module, a transfer module, and/or a holding module.

20. A method of operating a processing system controller in a semiconductor processing system including a host system and a processing system, the method comprising:
receiving a desired process result for at least one wafer from the host system;
creating a dynamic virtual module plan that comprises a process sequence for the at least one wafer, the process sequence being created to achieve the desired process result for the at least one wafer, the process sequence comprising a plurality of virtual module objects, wherein the virtual module objects comprise visited virtual module objects, associated with a visit by the at least one wafer to a physical module, and/or non-visited virtual module objects, associated with a non-visit by the at least one wafer to a physical module;
sending the dynamic virtual module plan to the host system
executing the process sequence;
collecting visited virtual module data when a visited virtual module object is executed; and
collecting non-visited virtual module data when a non-visited virtual module object is executed.

21. The method of 20, further comprising:
sending at least one of the visited virtual module data and the non-visited virtual module data to the host system.

22. The method of claim 20 further comprising:
executing a visited virtual module control strategy when a visited virtual module object is executed, wherein the visited virtual module control strategy comprises one or more visited virtual module control plans; and executing a visited virtual module data collection strategy, wherein the visited virtual module data collection strategy comprises at least one visited virtual module data collection plan.

23. The method of claim 22, further comprising;

executing a visited virtual module analysis strategy when a visited virtual module object is executed, wherein the visited virtual module analysis strategy comprises at least one of a visited virtual module analysis plan and a visited virtual module judgment plan.

24. The method of claim 22, further comprising:

determining a process recipe for each of the visited virtual module objects; and sending the process recipe for each of the visited virtual module objects to the host system.

25. The method of claim 20, further comprising:

executing a non-visited virtual module control strategy when a non-visited virtual module object is executed, wherein the non-visited virtual module control strategy comprises one or more non-visited virtual module control plans; and executing non-visited virtual module data collection strategy, wherein the non-visited virtual module data collection strategy comprises at least one non-visited virtual module data collection plan for collecting virtual module non-visit data.

26. The method of claim 20, further comprising:

determining a process recipe for each of the non-visited virtual module objects; and sending the process recipe for each of the non-visited virtual module objects to the host system.

27. The method of claim 20, further comprising:

receiving a process recipe for a visited virtual module object the process sequence;

modifying the process recipe for the visited virtual module object; and sending the modified process recipe to the host system.

28. The method of claim 20, further comprising:

receiving a process recipe for a non-visited virtual module object in the process sequence;

modifying the process recipe for the non-visited virtual module object; and sending the modified process recipe to the host system.

29. The method of claim 20, wherein the physical module comprises at least one of a processing module, a measurement module, a transfer module, and a holding module.

30. A method of operating a host controller in a semiconductor processing system that includes a host system and a processing system, the method comprising:

receiving a dynamic virtual module plan from the processing system that comprises a process sequence for the at least one wafer, wherein the process sequence is created to achieve the desired process result for the at least one wafer, the process sequence comprising a plurality of virtual module objects, that are associated with a visit by the at least one wafer to a physical module, and/or non-visited virtual module objects that are associated with a non-visit by the at least one wafer to a physical module;

executing the dynamic virtual module plan;

receiving visited virtual module data when the processing system executes the process sequence and a visited virtual module object is executed; and receiving non-visited virtual module data when a non-visited virtual module object is executed.

31. The method of claim 30, further comprising:

receiving, from the processing system, a process recipe for at least one visited virtual module object in the process sequence; and sending the process recipe for the at least one visited virtual module object to a database.

32. The method of claim 30 further comprising:

receiving, from the processing system, a process recipe for at least one non-visited virtual module object in the process sequence; and sending the process recipe for the at least one non-visited virtual module object to a database.

33. The method of claim 30, further comprising:

receiving, from the processing system, a process recipe for least one visited virtual module object in the process sequence;

modifying the process recipe for the at least one visited virtual module object; and sending the modified process recipe to the processing system.

34. The method of claim 30, further comprising:

receiving, from the processing system, a process recipe for least one non-visited virtual module object in the process sequence;

modifying the process recipe for the at least one non-visited virtual module object; and sending the modified process recipe to the processing system.

* * * * *

UNITED STATES PATENT AND TRADEMARK OFFICE
CERTIFICATE OF CORRECTION

PATENT NO. : 7,212,878 B2 Page 1 of 1
APPLICATION NO. : 10/927500
DATED : May 1, 2007
INVENTOR(S) : Funk and Natzle It is certified that error appears in the above-identified patent and that said Letters Patent is hereby corrected as shown below:

Column 27, line 8, "whe" should read --when a--.
Column 27, lines 12 and 13, "collection strategy wherein" should read --collection strategy, wherein--.
Column 27, line 19, "mod" should read --module--.
Column 27, line 27, "and/or holding module" should read --and/or a holding module--.
Column 27, line 30, "removal module a heating module" should read --removal module, a heating module--.
Column 28, line 11, "non-visit" should read --non-visits is--.
Column 28, line 18, "an" should read --and--.
Column 30, line 31, "for least one" should read --for at least one--.
Column 30, line 39, "for least one" should read --for at least one--.

Signed and Sealed this

Fourteenth Day of August, 2007

JON W. DUDAS
*Director of the United States Patent and Trademark Office*